US006768616B2

(12) United States Patent
Mergens et al.

(10) Patent No.: US 6,768,616 B2
(45) Date of Patent: Jul. 27, 2004

(54) ELECTROSTATIC DISCHARGE PROTECTION STRUCTURES FOR HIGH SPEED TECHNOLOGIES WITH MIXED AND ULTRA-LOW VOLTAGE SUPPLIES

(75) Inventors: Markus Paul Josef Mergens, Plainsboro, NJ (US); Cornelius Christian Russ, Princeton, NJ (US); John Armer, Middlesex, NJ (US); Koen Gerard Maria Verhaege, Gistel (BE)

(73) Assignees: Sarnoff Corporation, Princeton, NJ (US); Sarnoff Europe, Gistel (BE)

( * ) Notice: Subject to any disclaimer, the term of this patent is extended or adjusted under 35 U.S.C. 154(b) by 0 days.

(21) Appl. No.: 10/099,600

(22) Filed: Mar. 15, 2002

(65) Prior Publication Data

US 2002/0154463 A1 Oct. 24, 2002

Related U.S. Application Data

(60) Provisional application No. 60/276,415, filed on Mar. 16, 2001, provisional application No. 60/276,416, filed on Mar. 16, 2001, provisional application No. 60/276,424, filed on Mar. 16, 2001, and provisional application No. 60/318,548, filed on Sep. 11, 2001.

(51) Int. Cl.[7] .......................... H02H 3/22; H01L 29/74
(52) U.S. Cl. .......................... 361/56; 361/111; 257/355; 257/356
(58) Field of Search ............ 361/111, 56; 257/355–362

(56) References Cited

U.S. PATENT DOCUMENTS

| | | | |
|---|---|---|---|
| 5,272,097 A | 12/1993 | Shiota | 437/34 |
| 5,272,371 A | 12/1993 | Bishop et al. | 257/362 |
| 5,327,319 A * | 7/1994 | Lee et al. | 361/118 |
| 5,400,202 A | 3/1995 | Metz et al. | 361/56 |
| 5,426,322 A | 6/1995 | Shiota | 257/355 |
| 5,430,595 A | 7/1995 | Wagner et al. | 361/56 |
| 5,452,171 A | 9/1995 | Metz et al. | 361/56 |
| 5,465,189 A | 11/1995 | Polgreen et al. | 361/58 |
| 5,550,699 A | 8/1996 | Diaz | 361/56 |
| 5,561,577 A | 10/1996 | Motley | 361/56 |
| 5,591,661 A | 1/1997 | Shiota | 437/56 |
| 5,610,425 A | 3/1997 | Quitley et al. | 257/358 |
| 5,625,522 A | 4/1997 | Watt | 361/111 |
| 5,671,111 A | 9/1997 | Chen | 361/56 |
| 5,728,612 A | 3/1998 | Wei et al. | 438/200 |
| 5,754,380 A | 5/1998 | Ker et al. | 361/56 |
| 5,780,905 A | 7/1998 | Chen et al. | 257/355 |
| 5,781,388 A | 7/1998 | Quigley | 361/56 |
| 5,821,572 A | 10/1998 | Walker et al. | 257/107 |
| 5,843,813 A | 12/1998 | Wei et al. | 438/200 |
| 5,869,873 A | 2/1999 | Yu | 257/362 |
| 5,872,378 A * | 2/1999 | Rose et al. | 257/355 |
| 5,877,927 A * | 3/1999 | Parat et al. | 361/56 |
| 5,907,462 A | 5/1999 | Chatterjee et al. | 361/56 |
| 5,959,488 A * | 9/1999 | Lin et al. | 327/313 |

(List continued on next page.)

OTHER PUBLICATIONS

International Search Report, dated Aug. 20, 2002 for PCT applciation PCT/US02/07895.

*Primary Examiner*—Kim Huynh
(74) *Attorney, Agent, or Firm*—William J. Burke, Esq.

(57) ABSTRACT

An electrostatic discharge (ESD) protection circuit in a semiconductor integrated circuit (IC) having protected circuitry. In one embodiment, the ESD protection circuit includes a pad, adapted for connection to a protected circuit node of the IC, and an ESD protection device, which is coupled between the pad and ground. A diode turn-on device is coupled in a forward conduction direction from the pad to a first gate of the ESD protection device. In a second embodiment, the ESD protection circuit is an SCR having an anode coupled to a first voltage supply line, and a cathode coupled to ground. A parasitic capacitance is coupled between each the voltage supply line and the grounded cathode.

14 Claims, 16 Drawing Sheets

U.S. PATENT DOCUMENTS

| | | | |
|---|---|---|---|
| 5,959,821 A | 9/1999 | Voogel | 361/111 |
| 5,978,192 A * | 11/1999 | Young et al. | 361/56 |
| 5,982,601 A | 11/1999 | Lin | 361/111 |
| 6,002,567 A | 12/1999 | Zou et al. | 361/111 |
| 6,069,782 A | 5/2000 | Lien et al. | 361/111 |
| 6,125,021 A | 9/2000 | Duvvury et al. | 361/56 |
| 6,157,530 A | 12/2000 | Pequignot et al. | 361/111 |
| 6,233,130 B1 | 5/2001 | Lin | 361/118 |
| 6,304,127 B1 | 10/2001 | Lin | 327/321 |
| 6,411,485 B1 * | 6/2002 | Chen et al. | 361/111 |

* cited by examiner

ELECTROSTATIC DISCHARGE PROTECTION STRUCTURES FOR HIGH SPEED TECHNOLOGIES WITH MIXED AND ULTRA-LOW VOLTAGE SUPPLIES

CROSS REFERENCES

This patent application claims the benefit of U.S. Provisional Applications, serial No. 60/276,415, filed Mar. 16, 2001; 60/276,416, filed Mar. 16, 2001; serial No. 60/276,424, filed Mar. 16, 2001; and serial No. 60/318,548, filed Sep. 11, 2001, the contents of which are incorporated by reference herein.

FIELD OF THE INVENTION

This invention generally relates to the field of electrostatic discharge (ESD) protection circuitry and, more specifically, improvements for silicon controlled rectifier (SCR) and NMOS circuits in the protection circuitry of an integrated circuit (IC).

BACKGROUND OF THE INVENTION

The ongoing advancements in integrated circuit (IC) technologies have led to the use of lower supply voltages to operate the IC's. Lower supply voltages help cope with a problem of hot carrier induced, limited lifetime for the IC's. Designing IC's with lower supply voltages requires the use of very thin gate oxides. The thickness of the gate oxides influences the amount of drive current that is generated. The thinner the gate oxide layer, the more drive current is generated, which thereby increases the speed of the circuit. The gate oxides (e.g., silicon dioxide) may have a thickness of less than 3 nanometers, and further advancements will allow the gate oxide thickness to scale down even further. The lower supply voltages also allow the use of silicon controlled rectifiers (SCRs) with very low holding voltages (e.g., 1.5–2.0V) without introducing a risk of latch-up. The thin gate oxides, which are used in conjunction with low supply voltages, require extreme limitation of transient voltages during an ESD event.

A problem arises using the very thin gate oxides because the oxide breakdown voltage is less than the junction breakdown voltage (e.g., 6–9 volts) that triggers an ESD protection circuit, such as an SCR or NMOS device. For example, a grounded-gate SCR (GGSCR) may be used to provide ESD protection for an (I/O) pad. The GGSCR has a junction breakdown voltage between 6–9 volts, which provides the trigger current for the SCR. As advances in technology allow reduction of the thickness of the oxide thickness below 3 nanometers, the gate oxide is subject to damage at turn-on and high current clamping voltages greater than approximately 4–6 volts.

Therefore, there is a need in the art for an ESD protection device having a lower trigger voltage, as well as a lower holding and clamping voltage that can protect the gate oxide from damage during turn-on and operation.

SUMMARY OF INVENTION

The disadvantages heretofore associated with the prior art are overcome by various embodiments of an electrostatic discharge (ESD) protection circuit in a semiconductor integrated circuit (IC) having protected circuitry. In one embodiment, the ESD protection circuit comprises a pad, adapted for connection to a protected circuit node of the IC and an ESD protection device, coupled between the pad and ground. A diode turn-on device is coupled in a forward conduction direction from the pad to a first gate of the ESD protection device.

In a second embodiment, an ESD protection circuit in a semiconductor IC having protected circuitry and a plurality of mixed supply voltage lines, comprises an SCR having an anode coupled to a first voltage supply line and a cathode coupled to ground. Parasitic capacitance couples each voltage supply line to the grounded cathode. Optionally, at least one holding diode is coupled in a forward conductive direction from the first voltage supply line to the anode of the SCR. Optionally, at least one trigger diode is coupled in a forward conductive direction from the second trigger gate to a second voltage supply line.

As is discussed below, these two embodiments, as well as other various embodiments, provide ESD protection for the protected circuitry of an IC, such that the diode turn-on device provides a lower trigger voltage, as well as a lower holding and clamping voltage, which can protect the gate oxide from damage during turn-on and operation in the ESD event.

BRIEF DESCRIPTION OF THE DRAWINGS

To facilitate understanding, identical reference numerals have been used where possible, to designate identical elements that are common to the figures.

DETAILED DESCRIPTION OF THE INVENTION

The present invention is described with reference to CMOS devices. However, those of ordinary skill in the art will appreciate that selecting different dopant types and adjusting concentrations allows the invention to be applied to Bipolar, BiCMOS, SiGe/BiCMOS, and other processes that are susceptible to damage caused by ESD. The present invention includes various embodiments of an ESD protection device having a turn-on voltage, a holding voltage, and high current clamping characteristics such that ESD transient voltages will be properly limited to not damage a gate oxide or other vulnerable semiconductor device.

Figure 1:
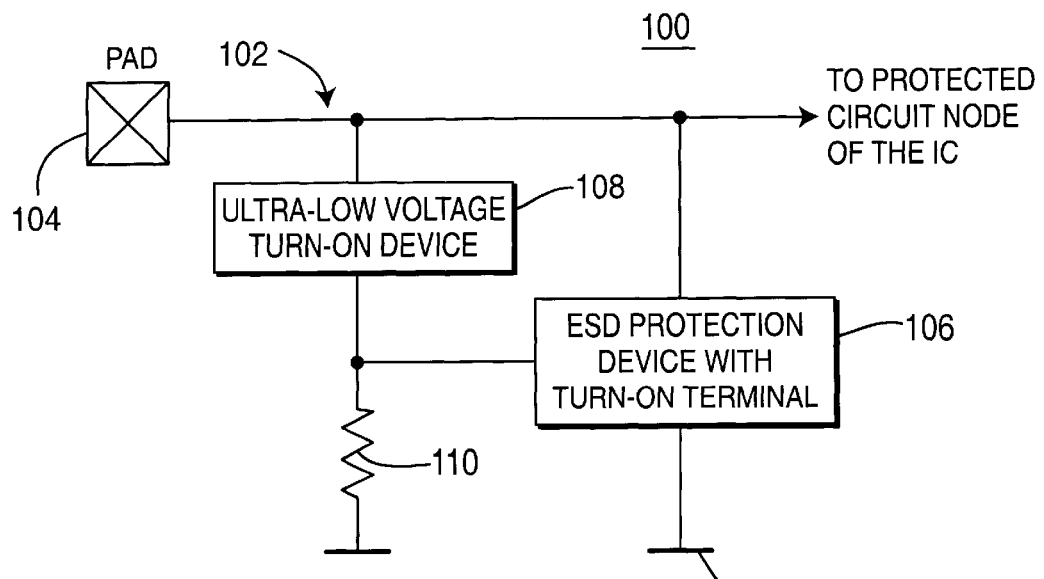
FIG. 1 depicts a schematic block diagram representing an ESD protection circuit of an integrated circuit (IC) having an ultra low turn-on voltage device.

FIG. 1 depicts a schematic block diagram representing an ESD protection circuit 102 of an integrated circuit (IC) 100. The representation illustratively depicts the ESD protection circuit 102 coupled to a protected node of the IC 100 and an IC pad 104. The pad 104 may be an input pad, and output pad, or a supply pad, and is coupled to a low voltage turn-on (i.e., "triggering") device 108 and an ESD protection device 106, such as a SCR or NMOS device. The ESD protection device 106 is coupled to ground 112. The ESD protection device 106 has a turn-on terminal (e.g., gate (not shown)) that is coupled to the triggering device 108. A shunt path 110 may optionally be coupled between the triggering device 108 and ground 112. The triggering device 108 and ESD protection device 106 (e.g., SCR) together serve as a protection device 102 for circuitry (not shown) on IC 100 also coupled to the pad 104.

In particular, the triggering device 108 and ESD protection device 106 protect the IC circuitry from electrostatic discharges (ESD) that may occur at the pad 104. When turned on, the ESD protection device 106 functions as a shunt to redirect any ESD currents from the pad 104 to ground 112. The trigger device 108 turns on (i.e., "triggers") the ESD protection device 106 to quickly dissipate the current, and as such avoid an over-voltage ESD condition, as is discussed in further detail below regarding each embodiment.

Figure 2:
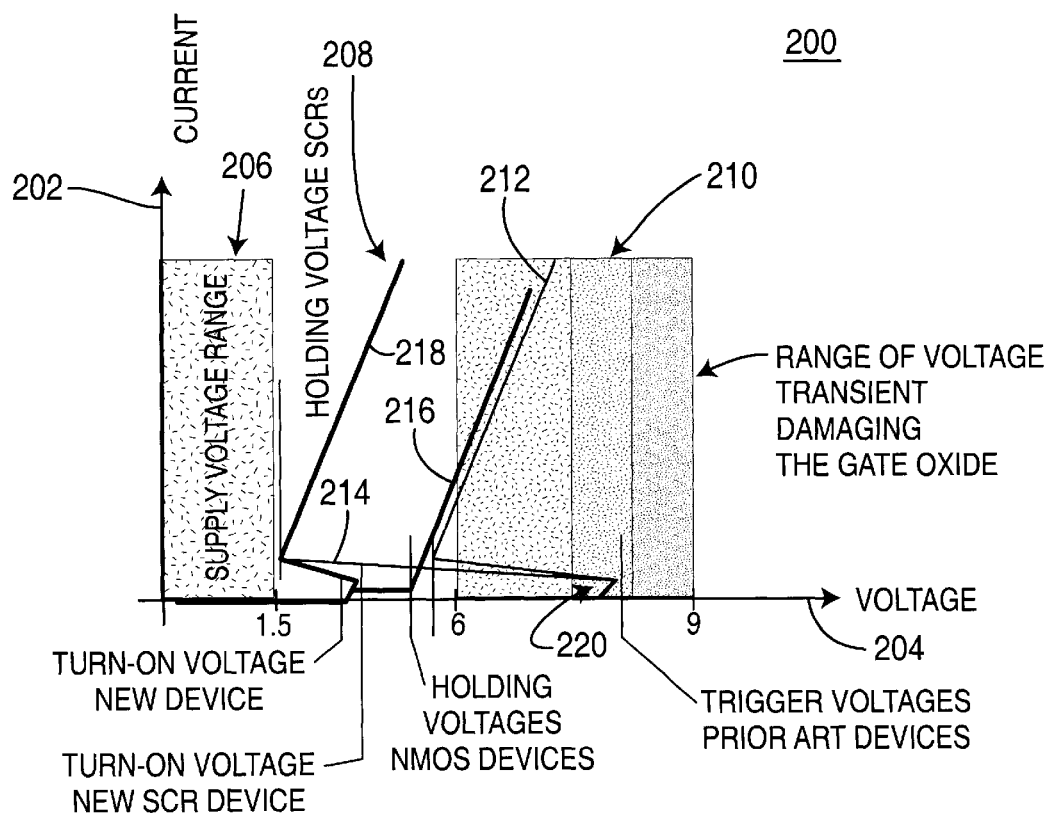
FIG. 2 depicts a graph of current and voltage characteristics for an ESD protection device.

FIG. 2 depicts a graph of current and voltage characteristics 200 for the ESD protection device 102 of the present invention. The graph comprises an ordinate 202 representing current characteristics of the ESD protection device 102, and an abscissa 204 representing voltage characteristics of the ESD protection device 102. The voltage characteristic is divided into three regions defined by particular voltages. In particular, a first region 206 for a low supply voltage has a voltage range of 0–1.5 volts. A second region 208 for the ESD protection device 102 holding voltage range is between 1.5 and 6 volts. A third region 210 for an over-voltage condition has a range of voltages transients capable of damaging the gate oxide of the ESD protection device 102, such as between 6–9 volts.

The current and voltage (IV) characteristics for both prior art NMOS and SCR protection devices are respectively represented by curves 212 and 214. Both prior art ESD protection devices have triggering voltages occurring in the over voltage range 210 (e.g., curve portions 220 on prior art curves 212 and 214), which may damage the gate oxide layer of the ESD protection device 102. The triggering voltage for both the SCR and NMOS protection devices is approximately the same in value (e.g., 7–9 volts). However, the holding voltage for the SCR device (1.5 to less than 5 volts) is less than the holding voltage of the NMOS protection device (approximately 5 volts).

As will be discussed regarding the embodiments depicted in FIGS. 3–19, the inventive ESD protection devices 102 have low triggering and holding voltages that are below the gate breakdown voltage (i.e., 6–9 volts) that damages the gate oxides of the ESD protection device 102. In particular, the triggering voltages of both the inventive ESD protection devices 102 fall within a tolerable voltage range of 1.5–6 volts. Moreover, the holding voltage, which provides the minimum voltage required to maintain the ESD protection device in a conductive "on" state, is within a tolerable voltage range, such that damage to the gate oxide is also minimized. For example, the SCR protection device represented by curve 218 has both a triggering and holding voltage range below 6 volts. Similarly, the NMOS protection device represented by curve 216 has a triggering voltage below 6 volts within a tolerable range, while its high holding voltage is slightly above 6 volts.

FIGS. 3–19 depict schematic diagrams of ESD protection devices 106 coupled to diode turn-on triggering devices 108 of the present invention. The ESD protection devices 106 in the embodiments of FIGS. 3–19, are capable of triggering and protecting the IC circuitry at low voltages of approximately 1.5 to 6 volts, as shown by the current/voltage (I/V) characteristics graph of FIG. 2.

Figure 3:
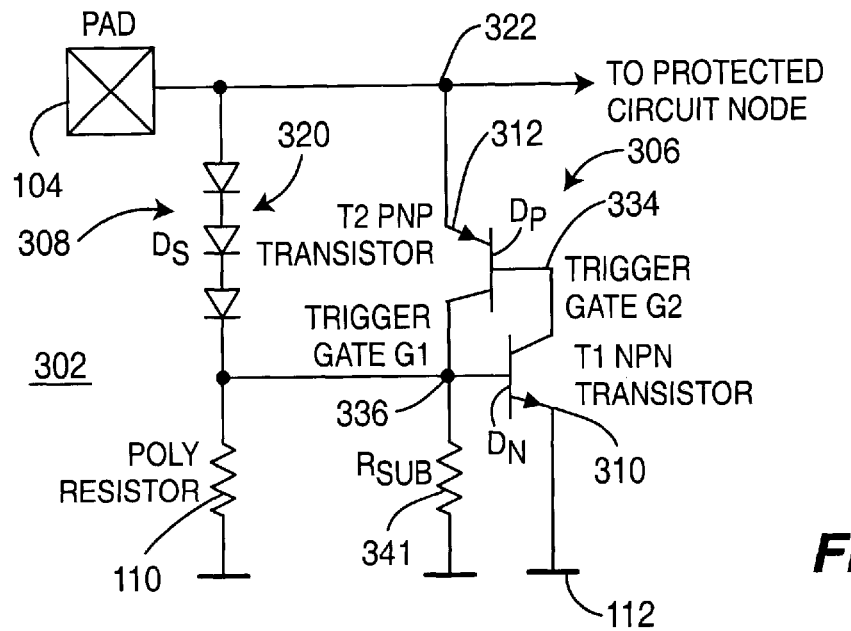
FIGS. 3 through 19 depict schematic diagrams of various embodiments of an ESD protection circuit incorporating the teachings of the generic ESD protection circuit of FIG. 1.

FIG. 3 depicts a schematic diagram of a first embodiment of an ESD protection device 302. In particular, FIG. 3 depicts a schematic diagram of a diode turn-on SCR (DTSCR) protection device 302 of the present invention. The DTSCR 302 comprises a diode turn-on ("triggering") device 308 and a SCR 306, which together serve as a protection device 302 for the circuitry on an integrated circuit (IC) 100. The DTSCR protection device 302 protects the IC circuitry from electrostatic discharges (ESD) that may occur at the pad 104, which is coupled to the IC circuitry. When turned on, the SCR 306 functions as a shunt to redirect any ESD currents from the pad 104 to ground. The diode turn-on trigger device 308 turns on, that is "triggers", the SCR 306 to avoid an over-voltage ESD condition.

Referring to the schematic diagram of FIG. 3, the SCR protection device 306 is illustratively represented as an NPN transistor T1 310 and a PNP transistor T2 $312_1$ as is well known in the art. The emitter of the PNP transistor T2 312 forms an anode 322 of the SCR 306, which is connected to the pad 104. The collector of the PNP transistor T2 312 is connected to a first node 336, which is also connected to the base of the NPN transistor T1 310, as well as to one side of a resistor $R_{sub}$ 341. The first node 336 includes a first trigger gate G1 of the NPN transistor T1 310. The other side of resistor $R_{sub}$ 341 is connected to ground 112, which serves as the cathode of the SCR 306. The resistor $R_{sub}$ 341 represents an intrinsic substrate resistance in the base of the NPN transistor T1 310 of the SCR 306, which is formed by local substrate ties coupled to ground 112. Furthermore, the emitter of the NPN transistor T1 310 is also connected to the grounded cathode 112. A second node 334 includes the base of the PNP transistor T2 312 and the collector of a NPN transistor T1 310. The second node 334 also may include coupling of an optional second trigger gate G2 for the PNP transistor T2 312. For a detailed understanding of a layout and cross-sectional implementation of an illustrative SCR and respective trigger gates, the reader is directed to U.S. patent application Ser. No. 10/007,833, filed Nov. 5, 2001, which is incorporated by reference herein, in its entirety.

A shunt resistor 110 is also coupled from the first node 336 to ground 112. The shunt resistor 110 is external to the SCR transistors T1 310 and T2 $312_1$ and is provided in parallel to the intrinsic resistance $R_{sub}$ 341 of the P-substrate of the SCR 306. In one embodiment, the resistor 110 is fabricated from a silicide-blocked poly-silicon, and is selected with a resistance value (e.g., 1–10 kilo-ohms), which is lower than the inherent substrate resistance $R_{sub}$ 341. The resistor 110 serves as a shunt for directing small amounts of current to ground 112. Therefore, resistor 110 provides a path for undesirable leakage currents between the trigger device 308 and ground 112, which otherwise might unintentionally trigger the SCR 302. Furthermore, the resistor 110 will control the so-called trigger and holding currents of the SCR 306.

The triggering device 308 includes a number of serially connected diodes $D_s$ (where s is an integer greater than zero) coupled between the anode 322 and the first node 336, which includes the collector of the PNP transistor T2 312 and the base of the NPN transistor T1 310. The diodes $D_s$ are, for example, three forward biased n-well diodes forming the diode chain 320. An anode of the first diode $D_1$ in the diode chain 320 is coupled to the pad 104, while the cathode of the last diode (e.g., $D_3$) in the chain 320 is coupled to the first node 336 (i.e., trigger gate G1). Each diode $D_s$ in the diode chain 320 typically has a forward biasing voltage of approximately 0.7 volts.

In operation, the protective SCR circuit 306, which comprises the NPN and PNP transistors T1 310 and T2 312$_1$ will not conduct current between the anode 322 and the grounded cathode 112. That is, the SCR 306 is turned off, since there is no high voltage (e.g., ESD voltage) applied to the pad 104. Rather, only the regular signal or operating voltage of the IC appears on the pad 104. In an instance where an ESD event causes an over voltage at the pad 104, the diodes $D_s$ in the diode chain 320 start to conduct considerable current.

In particular, once a voltage drop of approximately 0.7 volts across each diode in the diode chain 320 occurs, the diodes $D_s$ are forward biased. Since three diodes are illustratively shown in the diode chain 320, a voltage of 2.1 volts must appear across the diode chain 320 to forward bias all three diodes $D_s$ in the chain 320.

Initially, a majority of the current flows through the shunt resistor 110, since the shunt resistor 110 is in parallel with the substrate resistance $R_{sub}$ 341, which typically has a much greater resistance. However, a portion of the current through the diode chain 320 is fed into the trigger gate G1 336 of the SCR 306. Once a voltage drop across the shunt resistor 110 (and the parallel intrinsic resistance of the substrate $R_{sub}$) reaches approximately 0.7 volts, the NPN transistor T1 310 is turned on (i.e., triggered). Specifically, the base-emitter diode of the NPN transistor T1 310 is forward biased. As such, the NPN transistor T1 310 begins to conduct. The collector of the NPN transistor T1 310 provides carriers to the base of the PNP transistor T2 312$_1$ which turns on the PNP transistor T2 312. Thus, the DTSCR 302 of FIG. 3 has a turn-on voltage as between the anode 322 and ground 112 of approximately 2.8 volts (2.1V for the diode chain 320+ 0.7V for the base-emitter diode). Once both transistors T1 310 and T2 312 of the SCR 306 are turned on, the regenerative conduction process of the SCR 306 enables the ESD current to be quickly shunted to ground 112.

Referring to FIG. 2, curve 218 shows that a voltage of approximately 2.8 volts turns on (i.e., triggers) the SCR 306 into a conductive state. The SCR 306 continues to conduct current at a holding voltage of approximately 1.5V and at a clamping voltage in the range of 1.5 to 6 volts for higher currents. Thus, the triggering and holding/clamping voltages for the SCR 306 is less than the 69 volt range of the prior art, which may be harmful to the gate oxides of the IC 100.

Figure 4:
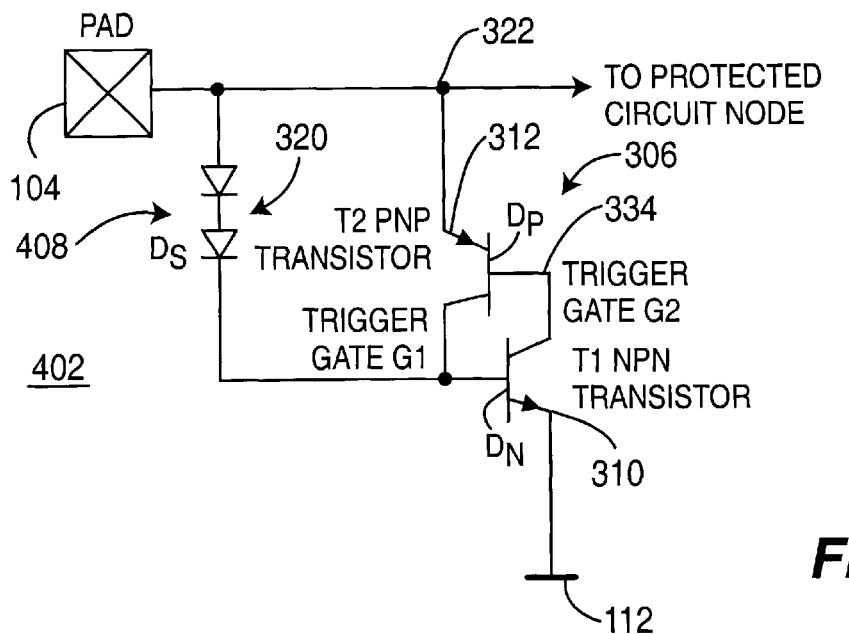

FIG. 4 depicts a schematic diagram of a second embodiment of the ESD protection device 402 of the present invention. In particular, FIG. 4 depicts a schematic diagram of the DTSCR protection device 402. The configuration of the diode turn-on SCR protection device 402 is configured the same as the DTSCR protection device 302 of FIG. 3, except that the SCR is fabricated in a process with an isolated P-well, and the substrate resistor 341 is not coupled between the first node 336 and ground 112. Furthermore, the poly shunt resistor 110 is not coupled between the first node 336 and ground 112. Moreover, one less diode is required in the diode chain 320, than used in the diode chain 320 of FIG. 3. In FIG. 4, the diode chain 320 of the diode turn-on device 408 comprises two diodes $D_s$.

The SCR 306 of the DTSCR protection device 402 triggers at a lower diode turn-on voltage than the first embodiment 302 of FIG. 3. Specifically, an ESD event occurring at the pad 104, which is positive with respect to ground 112, will forward bias the two diodes $D_s$ in the diode chain 320 at approximately 1.4 volts. Moreover, once the base to emitter junction of the NPN transistor T1 310 that forms a base-emitter diode $D_n$ rises to approximately 0.7 volts, the base to emitter diode $D_n$ is forward biased and conducts current, thereby triggering the SCR 306. Thus, the SCR 306 of the DTSCR protective device 402 is triggered at approximately 2.1 volts between the anode 322 and ground 112, as compared to the 2.8 volts required to trigger the DTSCR protective device 302 of FIG. 3, which has the extra diode in the diode chain 320, and the shunt resistor 110.

Figure 5:
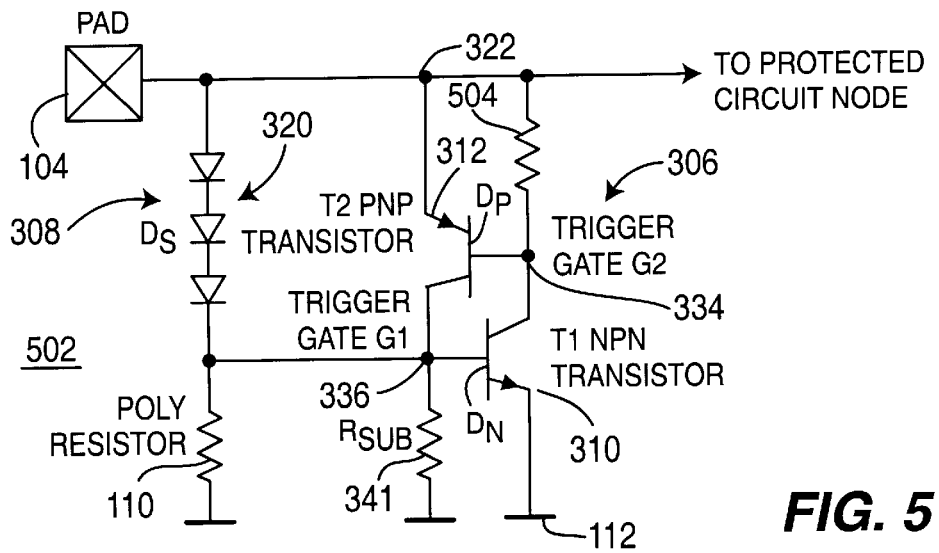

FIG. 5 depicts a schematic diagram of a third embodiment of an ESD protection device 502 of the present invention. In particular, FIG. 5 depicts a schematic diagram of the DTSCR protection device 502, such that the second node 334 has one or more N+ trigger taps in the N-well, which form trigger gate G2. In this third embodiment, the trigger gate G2 is coupled to the highest available voltage, i.e., the pad 104, via a resistor 504. The pad 104 and resistor 504 ensure a reduction in leakage current by providing a high potential to the N-well of the SCR 306, which turns the PNP transistor T2 312 completely off. Moreover, coupling the trigger gate G2 to the pad 104 also increases the SCR 306 trigger and holding currents to avoid a latch-up condition. The resistor 504 may be the intrinsic resistance of the N-well between one or more N+ trigger taps and the base of the PNP transistor 312 of the SCR 306. The resistor 504 may alternatively be the resistance of the N-well and/or an external resistor provided between the terminal of the first node 334 (i.e., trigger gate G2) and the pad 104. The triggering of this third embodiment is similar as described above regarding the DTSCR of FIG. 3.

Figure 6:
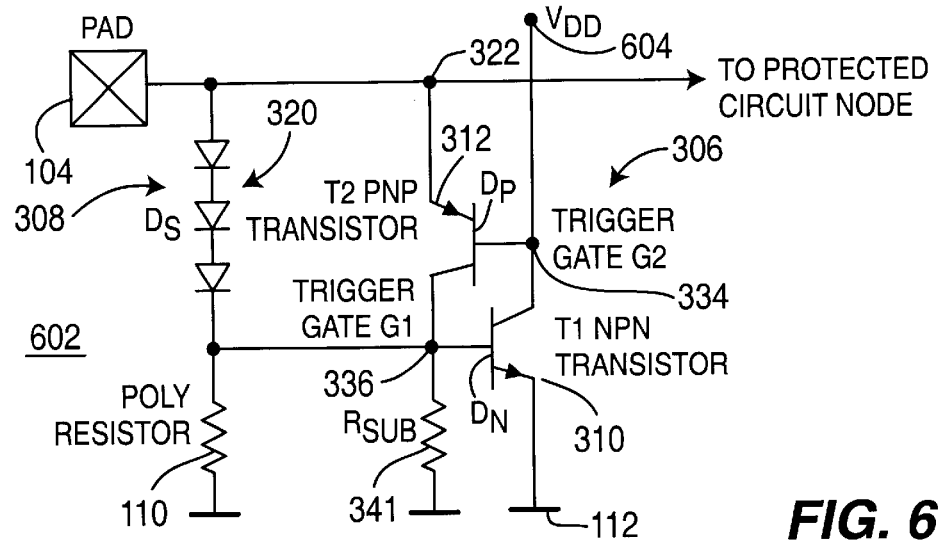

FIG. 6 depicts a schematic diagram of a fourth embodiment of the ESD protection device 602 of the present invention. In particular, FIG. 6 depicts a schematic diagram of the DTSCR protection device 602, where the DTSCR 602 is the same as the DTSCR protection device 302 of FIG. 3, except that the trigger gate G2 at the second node 334 is coupled to a positive supply voltage VDD 604. A large N+ doped region is provided in the N-well of the SCR 306, adjacent to the P+ doped region formed in the N-well, which serves as the anode 322 of the SCR 306.

The P+ region in the N-well serves dual purposes. First, the P+ to N-well junction forms the emitter-base diode $D_p$ of the PNP transistor T2 312. Second, the P+ region and adjacent high doped N+ region also form the large emitter-base diode $D_p$ in the PNP transistor T2 312$_1$ which is connected to the positive supply voltage VDD 604. The coupling of the diode $D_p$ to VDD 604 is often needed to cover other ESD stress types and polarities. Incorporating the diode $D_p$ in the SCR 306 avoids the implementation of a more area-consuming separate diode. The triggering of this third embodiment is similar as described above regarding the DTSCR 302 of FIG. 3. Moreover, similar to the third embodiment of FIG. 5, the supply voltage VDD 604 ensures a reduction in leakage current by providing a high potential to the N-well of the SCR 306, which turns the PNP transistor T2 312 completely off. Additionally, coupling the trigger gate G2 to the supply voltage VDD 604 also increases the SCR 306 trigger and holding currents to avoid a latch-up condition.

Figure 7:
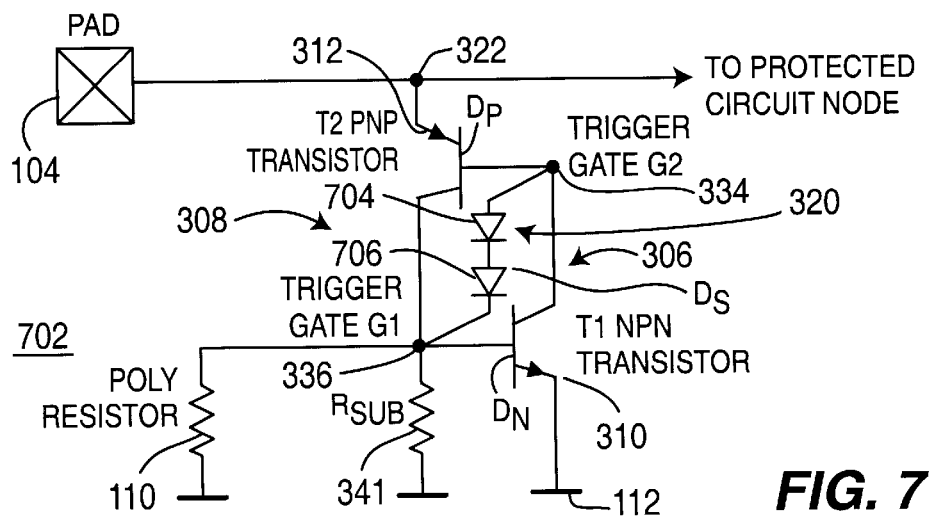

FIG. 7 depicts a schematic diagram of a fifth embodiment of the ESD protection device 702 of the present invention. Specifically, FIG. 7 depicts a schematic diagram of the DTSCR protection device 702, where the DTSCR protection device 702 is the same as the DTSCR protection device 302 of FIG. 3, except that one or more trigger diodes $D_s$ are coupled between the trigger gate G2 of the PNP transistor T2 312 and the trigger gate G1 of the NPN transistor T1 310.

In particular, two diodes 704 and 706 (i.e., $D_s$) are utilized in the diode chain 320. The diodes 704 and 706 are serially coupled in a forward conductive direction, such that an anode of the first diode 704 is coupled to the trigger gate G2 at the second node 334, while the cathode of the second diode 706 is coupled to the trigger gate G1 at the first node 336. The placement of the two diodes 704 and 706 of the diode chain 320 allows for a more compact implementation and slightly reduces the capacitive loading of the pad 104 by a reduced junction capacitance.

During an ESD event at the pad 104, four diodes must be forward biased to enable the SCR 306 to conduct and serve as a shunt to ground 112. Specifically, the emitter-base junction of the PNP transistor T2 312 forms a third diode $D_p$ in the diode chain 320, while the base-emitter junction of the NPN transistor T1 310 forms a fourth diode $D_n$ in the diode chain 320. It is noted that the third diode $D_p$, formed by the emitter-base junction of the PNP transistor T2 312$_1$ is actually the first diode in the diode chain 320 from the perspective of the pad 104. Once these four diodes in the diode chain 320 are all forward biased, the SCR 306 triggers and then shunts the ESD current to ground 112. It is noted that in this fifth embodiment, the SCR turn-on voltage is approximately 2.8 volts as between the anode 322 and ground 112. Moreover, the holding voltage of the SCR 306 is approximately 1.5 volts, as shown in FIG. 2. As such, the triggering and holding voltages will properly protect a gate oxide, as well as other vulnerable semiconductor devices during ESD stress.

Figure 8:
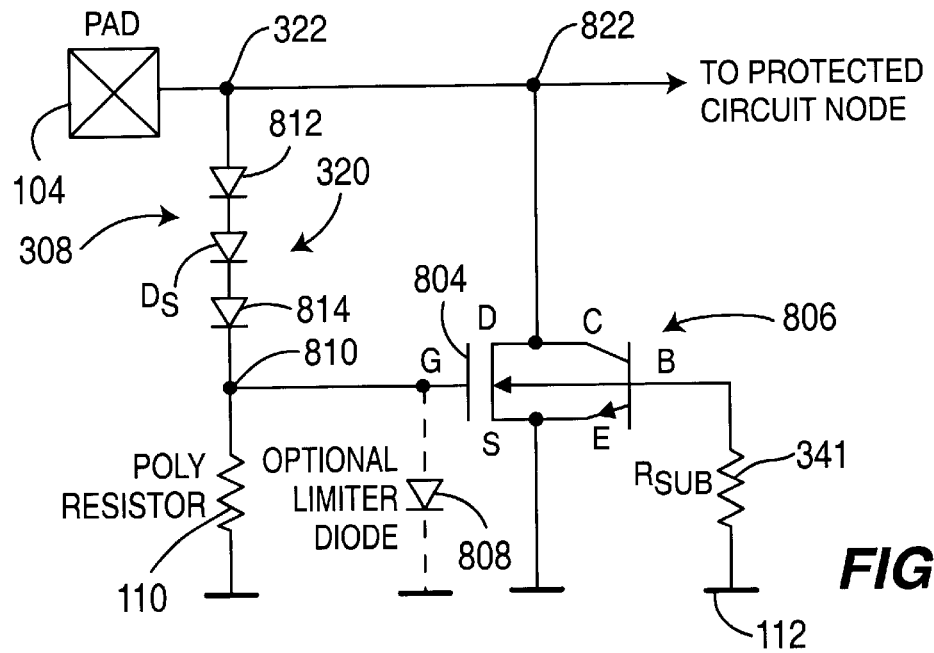

FIG. 8 depicts a schematic diagram of a sixth embodiment of the ESD protection device 802 of the present invention. In particular, FIG. 8 depicts a schematic diagram of a diode turn-on NMOS (DTNMOS) protection device 802 of the present invention. The configuration of the diode turn-on DTNMOS protection device 802 in this sixth embodiment is the similar as the DTSCR protection device 302 of FIG. 3, except that an NMOS device 804 is used instead of the SCR 306.

In particular, the serially connected turn-on diodes 320 are coupled between the pad 104 and a gate of the NMOS device 804 in the forward bias direction. More specifically, the anode of a first diode 812 in the diode chain 320 is coupled to the pad 104, while the cathode of the last diode 814 in the diode chain 320 is coupled to the gate of the NMOS device 804. Each diode is formed in a separate N-well, thereby allowing potential isolation from the common P-substrate. The diodes $D_s$ in the diode chain 320 may be sized to accommodate low current flow, which has a maximum current of approximately 10 nanoamps at the nominal voltage at the pad 104, as well as over the entire operating temperature range of the IC 100.

One end of a shunt resistor 110 is also coupled to the gate of the NMOS device 804. As such, the gate of the NMOS device, the last diode 814 in the diode chain 320, and the shunt resistor 110 define first node 810. The other end of the shunt resistor 110 is coupled to ground 112. The shunt resistor 110 has a resistance in the range of 1–10 Kohms. In the exemplary embodiment, three diodes $D_s$ are depicted in the diode chain 320. However, the number of diodes $D_s$ may be varied, as long as under normal circuit conditions, the maximum voltage at the pad 104 does not cause any considerable current leakage (e.g., above 100 nanoamps) to ground 112 via the diode chain 320 and the shunt resistor 110. Typically, the overall number of diodes $D_s$ in the diode chain 320 should not exceed 4 or 5 diodes. The typical voltage drop during normal operating conditions across each diode in the diode chain 320 is between 0.3 to 0.4 volts in order to keep the leakage current sufficiently low. During an ESD event, the voltage drop across each diode in the diode chain 320 is typically 0.7 volt.

The drain of the NMOS device 804 is coupled to the pad 104, while the source of the NMOS device 804 is coupled to ground 112. A parasitic NPN transistor 806, which is inherent to the NMOS device 804, is also shown in FIG. 8. In particular, the N+ doped regions forming the drain and source of the NMOS device 804 also respectively form the collector and emitter of the parasitic NPN transistor 806, while the P-substrate forms the base of the parasitic NPN transistor 806.

The NMOS device 804 is turned on by an ESD event occurring at the pad 104, such that a voltage drop of approximately 0.7 volts forms across each diode in the diode chain 320. Once the diodes $D_s$ in the diode chain 320 are forward biased, the diodes $D_s$ conduct and the current flows through the shunt resistor 110. When the voltage across the shunt resistor 110 rises above the gate threshold voltage (e.g., 0.5 volts) of the NMOS device 804, the NMOS device 804 turns on, thereby allowing the current to shunt to ground 112. Specifically, the current flows from the drain, and through the source of the NMOS device 804 to ground 112. Moreover, the parasitic NPN transistor 806 will conduct current through its collector and emitter to ground 112. As such, the NMOS device 804 (along with the parasitic NPN transistor 806) shunts the current from the pad 104 to ground 112. It is noted that the gate biasing of the NMOS device 804 by the diode chain 320 helps reduce the trigger voltage of the parasitic NPN transistor 806, as well as providing uniform triggering where multiple NMOS fingers are present.

An optional limiter diode 808 may also be coupled to the first node 810 and ground 112. In particular, the limiter diode 808 is coupled in a forward conducting direction from the gate of the NMOS device 804 to ground 112. The limiter diode 808 ensures that the voltage at the gate does not exceed a potential that may cause hot carrier damage to the gate oxide, in conjunction with the high currents flowing in the MOS devices under ESD operation. In particular, the limiter diode may have a forward biasing voltage of approximately 0.7 volts, which is above the gate threshold voltage of 0.5 volts.

Figure 9:
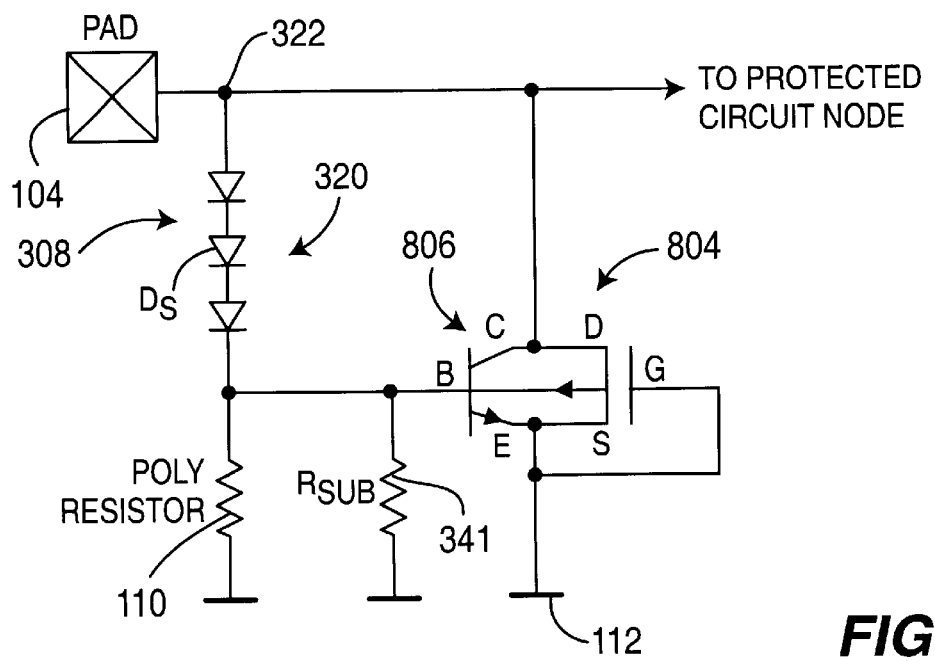

FIG. 9 depicts a schematic diagram of a seventh embodiment of the ESD protection device 902 of the present invention. In particular, FIG. 9 depicts a schematic diagram of the diode turn-on NMOS (DTNMOS) protection device 902, where the diode turn-on DTNMOS protection device 902 is similar as the DTNMOS protection device 802 of FIG. 8. However, the parasitic NPN transistor 806 is used as the triggering point to turn-on the NMOS device 804, rather than the gate of the NMOS device 804.

In particular, the gate of the NMOS device 804 is coupled to ground 112 to turn off any MOS current. Further, the diode chain 320 is coupled to the base of the parasitic NPN transistor 806, which is also coupled to ground 112 via the shunt resistor 110. The intrinsic resistance $R_{sub}$ 341 of the substrate is also shown as coupled to ground 112 in parallel with the shunt resistor 110.

During an ESD event at the pad 104, the diodes $D_s$ in the diode chain 320 conduct, and the current flows through the shunt resistor 110. The diodes $D_s$ in the diode chain 320 are forward biased at approximately 0.7 volts each. When the voltage across the shunt resistor 110 rises above the base-emitter forward biasing voltage (e.g., 0.7 volts) of the parasitic NPN transistor 806, the parasitic NPN transistor 806 turns on (i.e., conducts), thereby allowing the current to flow from the collector, through the emitter, to ground 112. As such, the NMOS device 804 (along with the parasitic NPN transistor 806) is utilized to shunt the current from the pad 104 to ground 112 at a triggering voltage of approximately 2.8 volts and at a holding voltage of approximately 5 volts.

Figure 10:
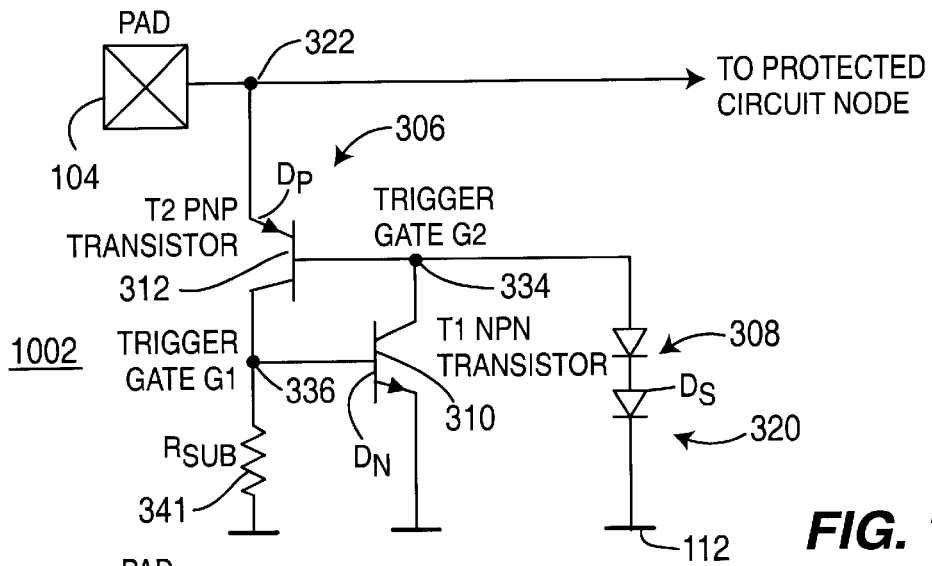
Figure 11:
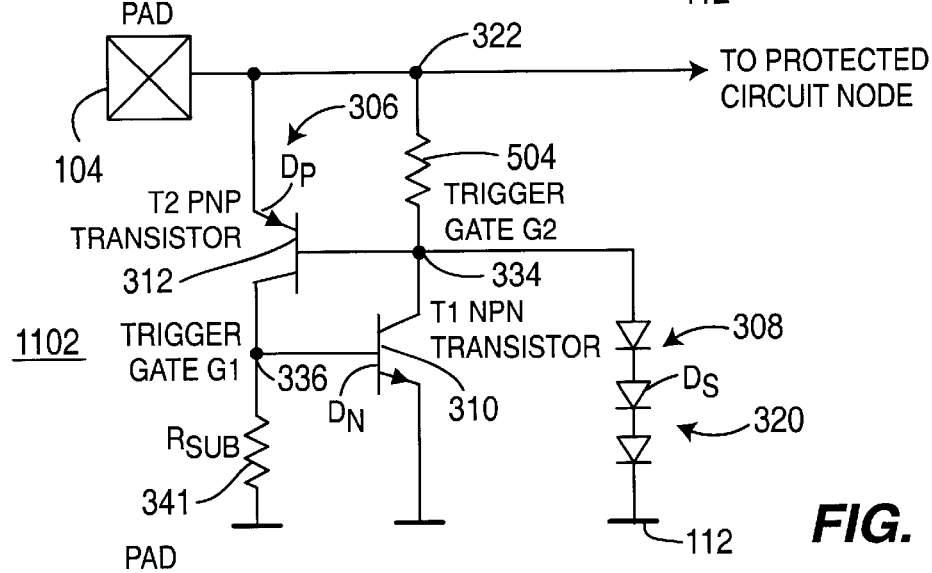
Figure 12:
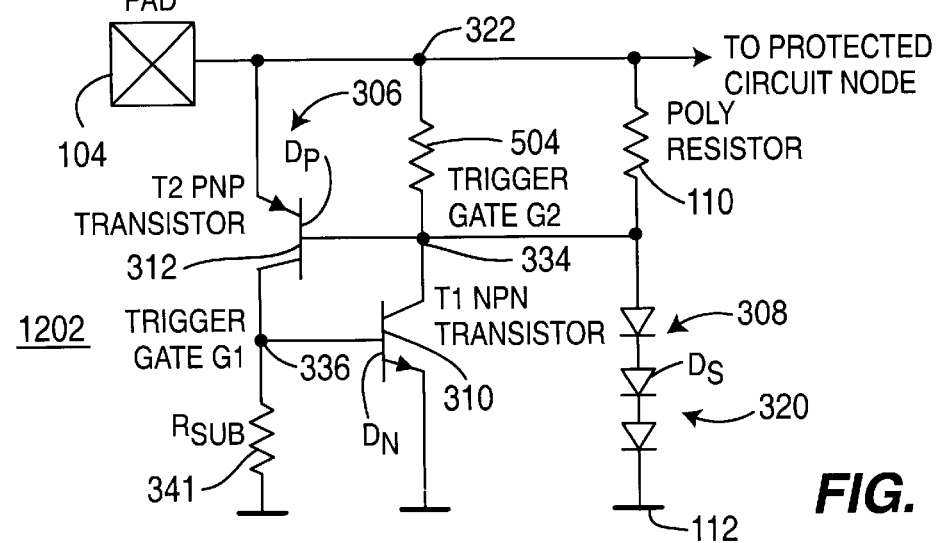

FIGS. 10–12 depict various complementary ESD protection device embodiments of the present invention. For each of these embodiments, the trigger device 308 is coupled between a trigger gate G2 334 of the PNP transistor T2 312 of the SCR 306 and ground 112, instead of between the pad 104 and the trigger gate G1 336 of the NPN transistor T2 310 of the SCR 306.

In particular, FIG. 10 depicts a schematic diagram of a DTSCR protection device 1002, which comprises the SCR 306 and the triggering device 308. The SCR 306 is the same as described in the other embodiments above, having first and second trigger gates G1 and G2. It is noted that the n-well is floating, such that there is no intrinsic n-well resistance $R_{nwell}$. It is also noted that a shunt resistor 110 is not utilized, as discussed with regard to the embodiment 402 of FIG. 4.

The triggering device 308 comprises the diode chain 320 formed by the serially connected diodes $D_s$, which are coupled between the trigger gate G2 at the second node 334 and ground 112. As such, this eighth embodiment 1002 may be considered as complementary to the second embodiment 402 of FIG. 4, which has the trigger device 308 coupled between the pad 104 and the trigger gate G1 of the NPN transistor T1 310 at the first node 336.

The diode chain 320 illustratively comprises two diodes $D_s$, which are in the forward bias direction from the trigger gate G2 334 to ground 112. When an ESD event occurs at the pad 104, the emitter-base junction of the PNP transistor T2 312 acts as a diode $D_p$, and begins to conduct. The diodes $D_s$ in the diode chain 320 also begin to conduct and the current flows to ground 112. Once the voltage potential across the emitter-base diode $D_p$ of the PNP transistor T2 312 and each diode $D_s$ in the diode chain 320 rises to approximately 0.7 volts, the emitter-base diode $D_p$ of the PNP transistor T2 312 and diodes $D_s$ in the diode chain 320 are all forward biased. The current flows from the emitter to the collector (which also forms the base of the NPN transistor T1 310) of the PNP transistor T2 $312_1$ to initiate the regenerative conduction process of the SCR 306.

The voltage potential occurring across the diode chain 320 (e.g., having two diodes $D_s$ between the trigger gate G2 and ground) is approximately 1.4 volts, while the voltage drop across the emitter-base of the PNP transistor T2 312 is approximately 0.7 volts. Thus, the PNP transistor T2 312 of the SCR 306 will trigger when the emitter-base diode $D_p$ of the PNP transistor T2 312 and diode chain 320 reaches approximately 2.1 volts. Referring to FIG. 2, both the triggering voltage and the holding voltage are below the voltage region 210 (i.e., less than 6 volts), which may be considered harmful (e.g., destructive) to the gate oxides.

FIG. 11 depicts a schematic diagram of a ninth embodiment of the ESD protection device 1102 of the present invention. In particular, FIG. 11 depicts a schematic diagram of the DTSCR protection device 1102, where the DTSCR protection device 1102 is the same as the DTSCR protection device 1002 of FIG. 10, except that a resistor 504 is coupled between the pad 104 and the trigger gate G2 of the PNP transistor T2 $312_1$ at the second node 334. The resistor 504 is, illustratively, the intrinsic resistance of the n-well, as discussed with regard to FIG. 5. Specifically, the trigger gate G2 is coupled to the highest available voltage, i.e., the pad 104, via a resistor 504. The pad 104 and resistor 504 ensure a reduction in leakage current by providing a high potential to the N-well of the SCR 306, which turns the PNP transistor T2 312 completely off.

The trigger device 308 illustratively comprises three diodes $D_s$ in the diode chain 320. When an ESD event occurs at the pad 104, the emitter-base junction of the PNP transistor T2 312 acts as a diode $D_p$, and is forward biased at approximately 0.7 volts. The diodes $D_s$ in the diode chain 320 also begin to conduct. Once the voltage potential across each diode $D_s$ in the diode chain 320 rises to approximately 0.7 volts, the diodes $D_s$ in the diode chain 320 are also forward biased. As such, the voltage drop occurring across the diode chain 320 is approximately 2.1 volts. Thus, the PNP transistor T2 312 of the SCR 306 will trigger once the voltage between the anode 322 and ground 112 reaches approximately 2.8 volts. Referring to FIG. 2, both the triggering voltage and the holding voltage are below (i.e., less than 6 volts) the voltage region 210, which is considered harmful to the gate oxides.

FIG. 12 depicts a schematic diagram of a tenth embodiment of the ESD protection device 1202 of the present invention. In particular, FIG. 12 depicts a schematic diagram of the DTSCR protection device 1202, where the DTSCR protection device 1202 is the same as the DTSCR protection device 1102 of FIG. 11, except that the shunt resistor 110 is coupled between the pad 104 and the trigger gate G2 of the PNP transistor T2 $312_1$ at the second node 334. Similar to the embodiment of FIG. 3, the shunt resistor 110 is parallel with the resistor 504 and has a resistance value much lower than the intrinsic resistance 504. As such, the current produced by an ESD event at the pad 104 flows initially through the shunt resistor 110, rather than the resistor 504, illustratively the intrinsic resistance 504 of the n-well. The shunt resistor 110 provides a path for undesirable leakage currents between the trigger device 308 and ground 112, which otherwise might unintentionally trigger the SCR 306. Furthermore, the shunt resistor 110 will control the so-called trigger and holding currents of the SCR 306.

Figure 13:
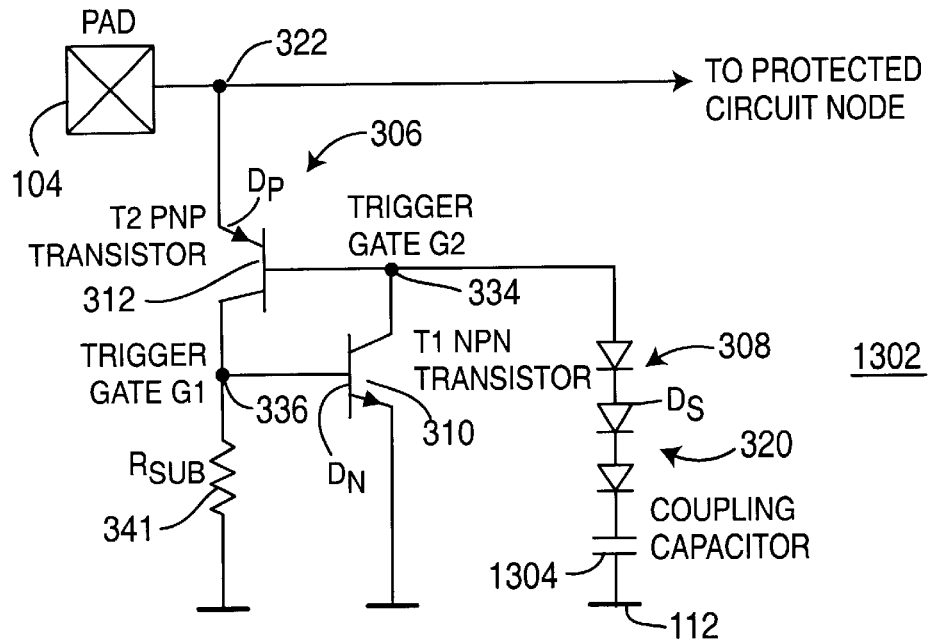

FIGS. 13–16 depict schematic diagrams of various SCR protection devices utilizing one or more coupling capacitors in the ESD protective circuitry. FIG. 13 depicts a schematic diagram of the DTSCR protection device 1302, where the DTSCR protection device 1302 is the same as the DTSCR protection device 1002 of FIG. 10, but includes capacitive grounding via a coupling capacitor 1304. In particular, the coupling capacitor 1304 is coupled in series between the diode chain 320 and ground 112. During a transient ESD event, the transient current will flow through the coupling capacitor 1304, while any non-transient (DC) current will be blocked by the coupling capacitor 1304. The coupling capacitor 1304 may have a capacitance value in the range of 1 pF (pico-Farads to 1 nF (nano-Farads). Once the emitter-base diode $D_p$ of the PNP transistor T2 $312_1$ as well as the diodes $D_s$ in the diode chain 320 are forward biased (e.g., 0.7 volts), the SCR 306 turns on and shunts the ESD current from the pad 104 to ground 112.

Figure 14:
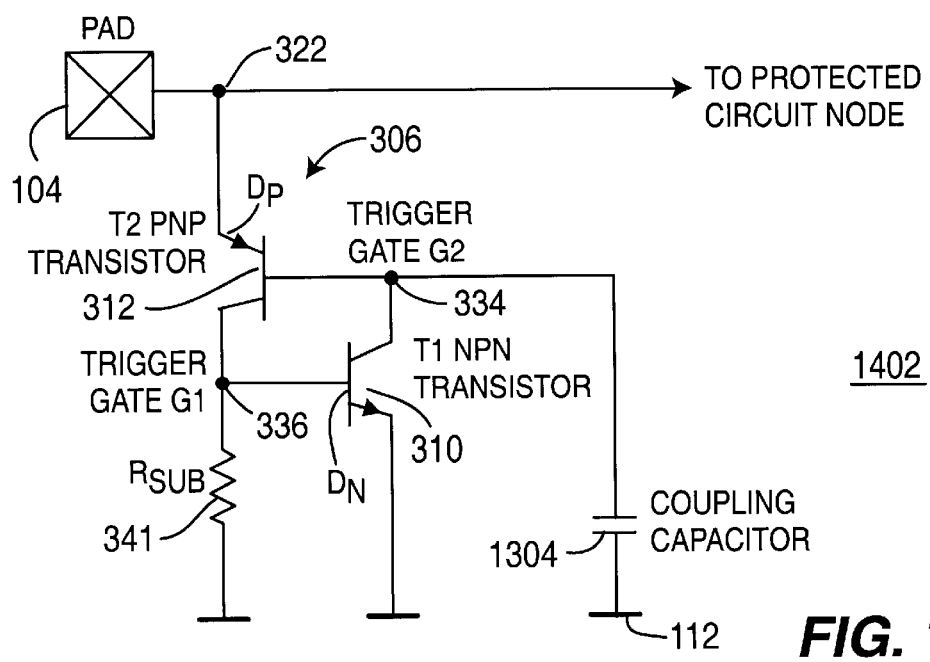

FIG. 14 depicts a schematic diagram of the SCR protection device 1402, which is the configured as the SCR protection device 1302 of FIG. 13, except that the turn-on diodes $D_s$ in the diode chain 320 are not utilized. That is, the coupling capacitor 1304 is used instead of the turn-on diodes $D_s$ in the diode chain 320, such that the protection device 1302 may be said to be a capacitive turn-on SCR (CTSCR). In particular, the SCR 306 is turned on by capacitive grounding a coupling capacitor 1304 directly between the second gate G2 334 of the SCR 306 and ground 112. During a transient ESD event, the transient ESD current will initially flow through the coupling capacitor 1304, while any non-transient (DC) current will be blocked by the coupling capacitor 1304.

Moreover, in the initial phase of the ESD pulse, the coupling capacitor 1304 pulls the trigger gate G2 334 of the SCR 306 to approximately ground potential. In other words, the voltage drop across the capacitor is practically negligible. Once the emitter-base diode $D_p$ of the PNP transistor T2 312 is forward biased at approximately 0.7 volts, the SCR 306 turns on and shunts the ESD current from the pad 104 to ground 112. As such, the SCR 306 turn-on voltage across the emitter-base diode $D_p$ of the PNP transistor T2 312 and the coupling capacitor 1304 is approximately 0.7 volts, which is below the voltage region 210 (i.e., less than 6 volts) that is considered harmful to the gate oxides.

Figure 15:
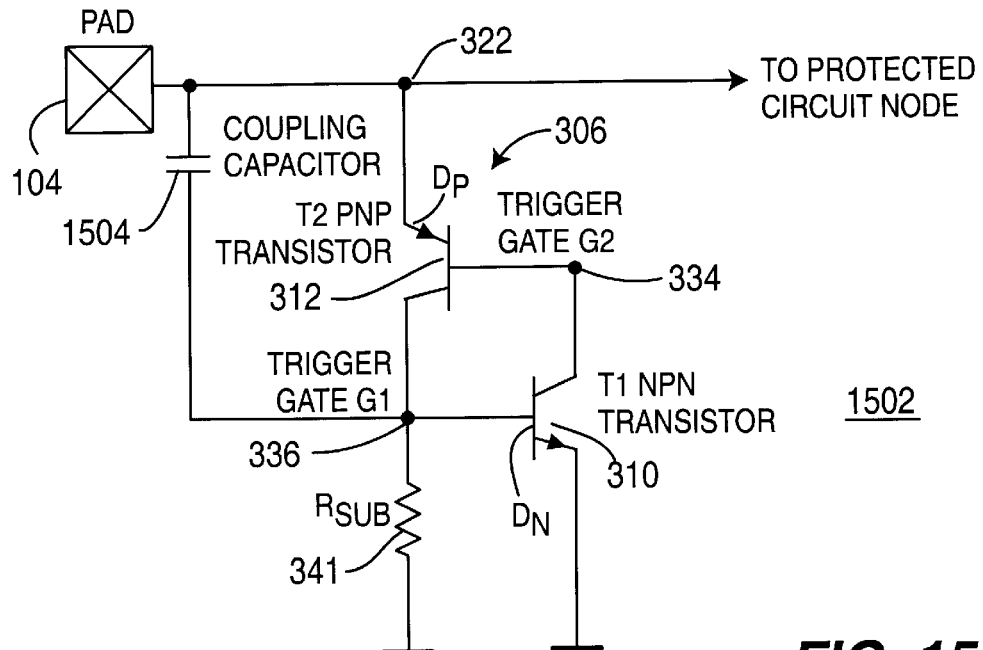

FIG. 15 depicts a schematic diagram of the SCR protection device 1502, which is configured as the SCR protection device 1402 of FIG. 14, except that the coupling capacitor 1504 is coupled between the pad 104 and the trigger gate G1 336 of the NPN transistor T1 310. During a ESD event, initially the transient current will flow through the coupling capacitor 1504, while any non-transient (DC) current will be blocked by the coupling capacitor 1504. Once the base-emitter diode $D_n$ of the NPN transistor T1 310 is forward biased (e.g., 0.7 volts), the SCR 306 turns on and shunts the ESD current from the pad 104 to ground 112. As such, the SCR 306 turn-on voltage across the base-emitter diode $D_n$ of the NPN transistor T1 302 and the coupling capacitor 1304 is approximately 0.7 volts (i.e., less than 6 volts), which is below the voltage region 210 that may be harmful to the gate oxides.

Figure 16:
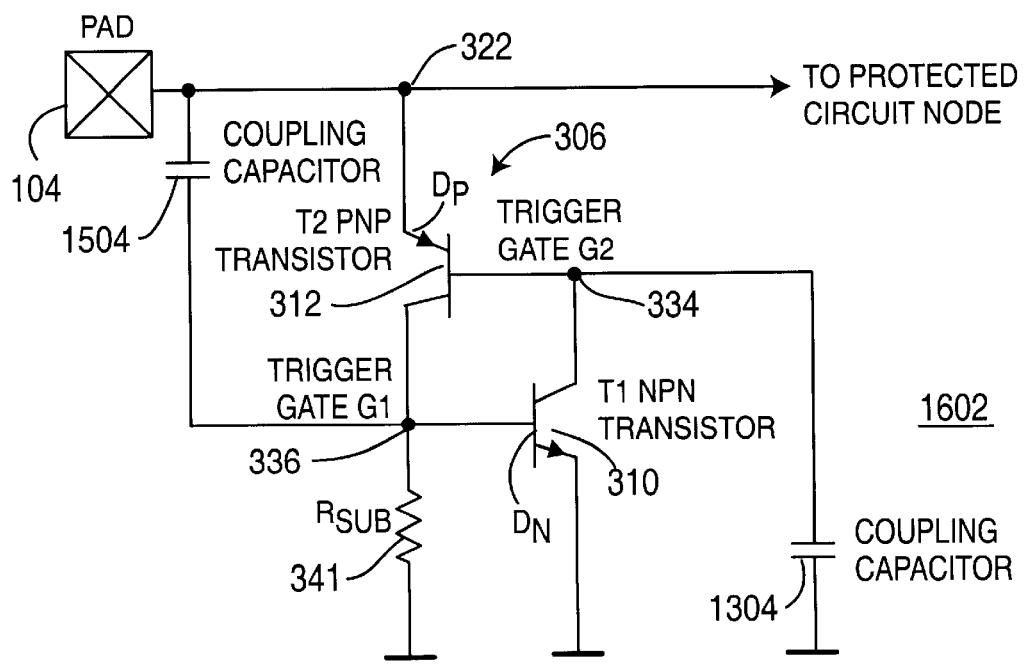

FIG. 16 depicts a schematic diagram of the SCR protection device 1602, which is the configured as a combination of the SCR protection devices 1402 and 1502 of FIGS. 14 and 15. In particular, capacitive grounding is provided by connecting coupling capacitor 1304 directly between the second gate G2 334 of the SCR 306 and ground 112. Further, coupling capacitor 1504 is coupled between the pad 104 and the trigger gate G1 336 of the NPN transistor T1 310. During a ESD event, initially the transient currents will flow through the coupling capacitors 1304 and 1504, while any non-transient (DC) current will be blocked by the coupling capacitors 1304 and 1504. Once the emitter-base diode $D_p$ of the PNP transistor T2 $312_1$ or the base-emitter diode $D_n$ of the NPN transistor T1 310 is forward biased (e.g., 0.7 volts), the SCR 306 turns on and shunts the ESD current from the pad 104 to ground 112.

Figure 17:
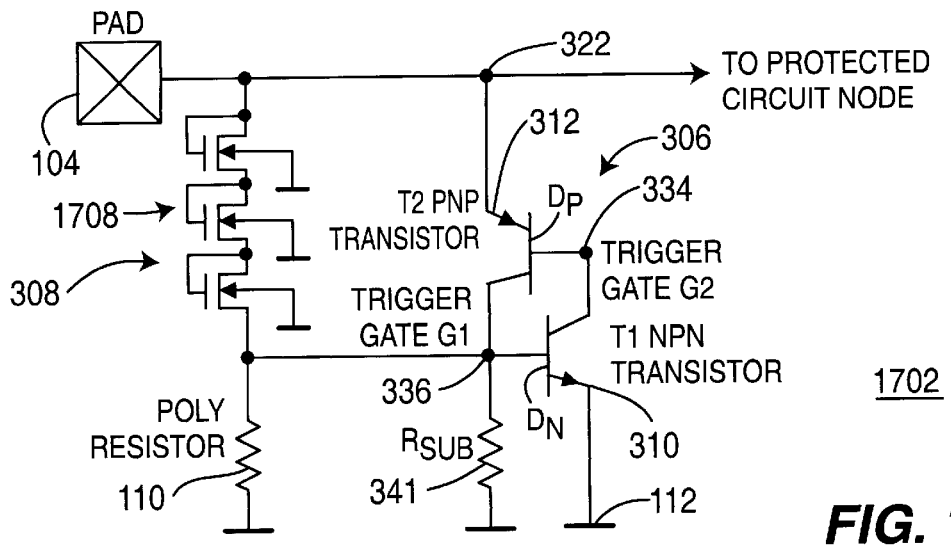
Figure 18:
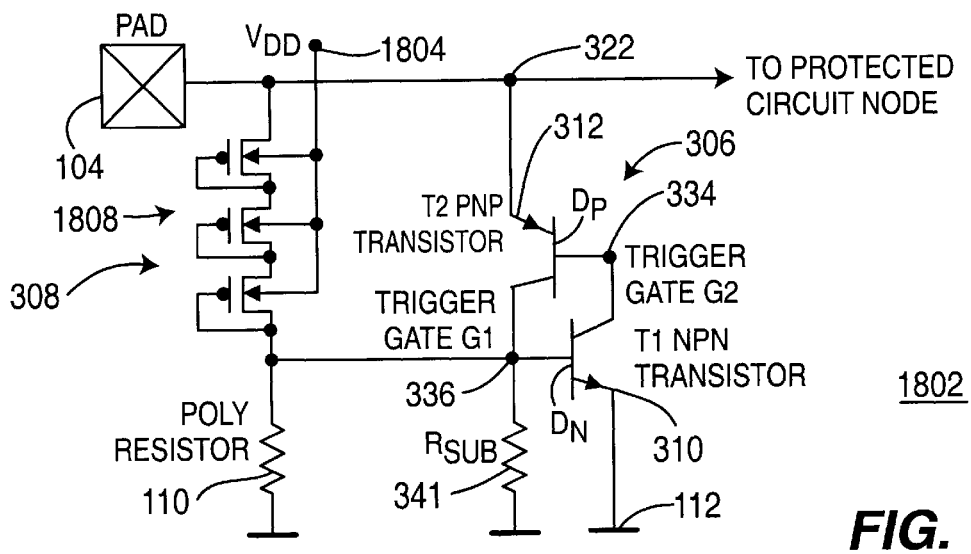

FIGS. 17 and 18 depict schematic diagrams of the SCR protection devices utilizing a number of serially coupled MOS devices as the turn-on device 308 of the ESD protective circuitry, rather than the diode chain 320. The ESD protection devices 1702 and 1802 of FIGS. 17 and 18 are the similar to the embodiment shown in FIG. 3, except a plurality of serially connected MOS devices are coupled between the pad 104 and the trigger gate G1 336 of the NPN transistor T1 310 of the SCR 306.

In particular, FIG. 17 illustratively depicts three NMOS devices 1708 serially coupled between the pad 104 and the trigger gate G1 336 of the NPN transistor T1 310. Alternately, FIG. 18 illustratively depicts three PMOS devices 1808 serially coupled between the pad 104 and the trigger gate G1 336 of the NPN transistor T1 310. As similarly discussed above with regard to the diode turn-on devices $D_s$ of FIGS. 3–16, the number of MOS devices (i.e., NMOS or PMOS) that are serially connected may vary between 1 to 8 devices.

Referring to FIG. 17, the gate and the drain of the NMOS devices 1708 are coupled to a high potential, compared to the source ("Diode-connected MOS"). As such, the NMOS devices 1704 are normally in an "on" state. Once a threshold voltage (i.e., "knee voltage" as similar to a forward biased diode) (e.g., 0.2–0.7 volts) is exceeded, the current rapidly increases such that the NMOS devices 1708 act as forward biased diodes.

During an ESD event occurring at the pad 104, current initially flows through the NMOS devices 1704 to ground 112, via the shunt resistor 110. Once the voltage potential across each NMOS device 1704 exceeds the threshold voltage, the current through the shunt resistor 110 increases, thereby increasing the voltage across the shunt resistor 110. When the voltage across the shunt resistor 110 reaches approximately 0.7 volts, the base-emitter diode of the NPN transistor T1 310 is forward biased, thereby triggering the SCR 306.

In an instance where three NMOS devices 1704 are used having a threshold voltage of approximately 0.5 volts each, the voltage potential across the three NMOS devices 1704 is approximately 1.5 volts. As such, the SCR 306 turn-on voltage across the base-emitter diode $D_n$ (0.7 volts) of the NPN transistor T1 302 and the NMOS devices 1704 is approximately 2.2 volts, which is below the voltage region 210 (i.e., less than 6 volts) that may be harmful to the gate oxides.

Referring to FIG. 18, the gate and drain of each PMOS devise 1804 is coupled to a low voltage potential (e.g., VDD 1804) compared to the source. As such, the PMOS devices 1804 are normally in an "on" state. During an ESD event, the same analysis may be applied to the PMOS device 1804 of FIG. 18 as applied to the NMOS devices 1704 of FIG. 17.

Figure 19:
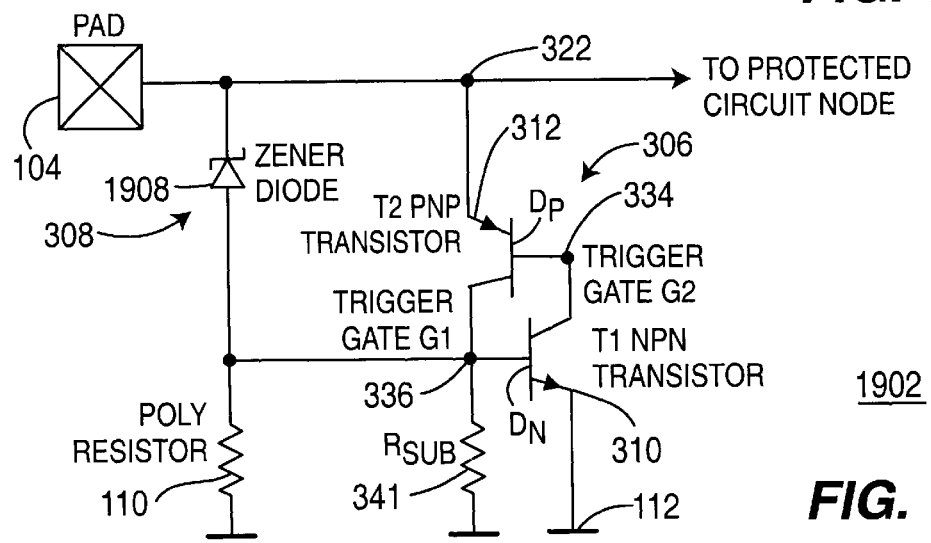

FIG. 19 depicts a schematic diagram of the SCR protection device 1902 having a reversed biased Zener diode 1908 as the turn-on device 308 of the ESD protective circuitry 1908, rather than the diode chain 320 of FIGS. 3–16. The ESD protection device 1902 is the same as the embodiment of FIG. 3, except that a reversed biased Zener diode 1908 is coupled between the pad 104 and the trigger gate G1 336 of the NPN transistor T1 310 of the SCR 306. During an ESD event occurring at the pad 104, current flows from the anode 322 to ground 112, via Zener diode 1908 and the shunt resistor 110.

Once the voltage across the Zener diode 1908 reaches the breakdown voltage (e.g., 3–6 volts), the current through the shunt resistor 110 increases, thereby increasing the voltage potential across the shunt resistor 110. When the voltage across the shunt resistor 110 reaches approximately 0.7 volts, the base-emitter diode $D_n$ of the NPN transistor T1 310 is forward biased, thereby triggering the SCR 306 into conduction, which shunts the ESD current from the pad 104 to ground 112.

Zener diodes are usually formed by a junction, such as a P-type lightly doped drain (PLDD) doping) and a N-type highly doped region (N+), or a N-type lightly doped drain (NLDD) doping and a P-type highly doped region (P+), or a combination of both PLDD and NLDD doping. However, these Zener diodes have breakdown voltages of typically 6–12V, which is too high for the protection of may ultra thin gate oxides.

Figure 31:
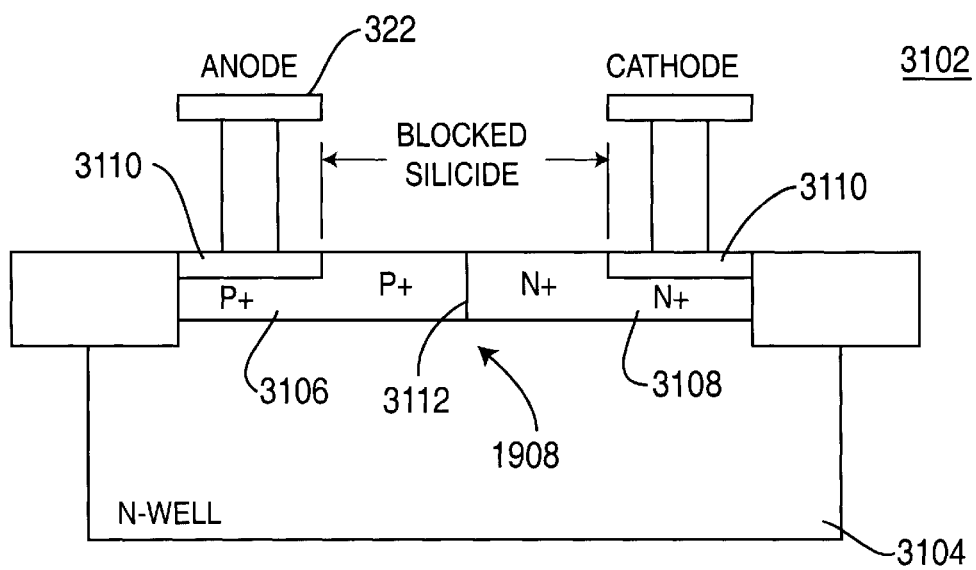
FIG. 31 depicts a cross-sectional view of an SCR having a Zener diode triggering device of the present invention.

FIG. 31 depicts a cross-sectional view of a Zener diode triggering device 1908 of the present invention. In particular, an N-well 3104 formed on a P-substrate (not shown) comprises a P+ doped region 3106 formed adjacent to an N+ doped region 3108, which forms a junction 3112 therebetween. A portion of the P+ doped region has a silicide layer 3110, where a contact is provided to form the anode 322 of the Zener diode 1908. Likewise, a portion of the N+ doped region 3108 has a silicide layer 3110, where a contact is provided to form the cathode of the Zener diode 1908. An area between the silicided layers 3110 and over the junction 3112 is silicide blocked to prevent a surface short circuit. In one embodiment, the N+ to P+ junction 3112 establishes a breakdown voltage of typically 3–6V.

One skilled in the art will recognize that attentive process evaluation must be performed to determine any increased leakage current in such a structure, which may have a detrimental impact on the application in an ESD protection device. In worst case, the SCR 306 turn-on voltage across the base-emitter diode $D_n$ of the NPN transistor T1 302 and the Zener diode 1908 is approximately 6.7 volts, which is in the low end of the voltage region 210 (i.e., approximately 6 volts), which may be harmful to the gate oxides.

Figure 20:
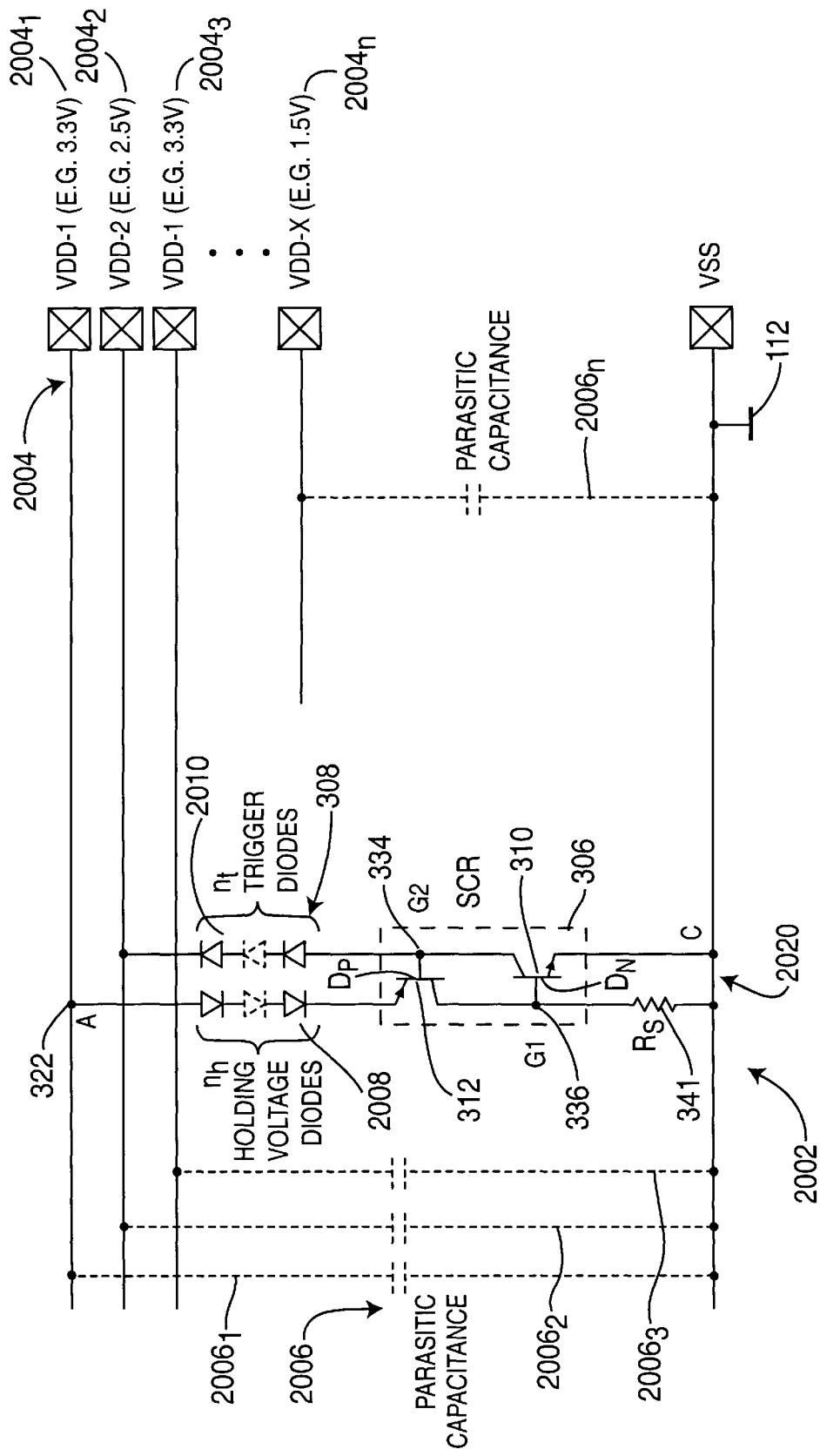
FIG. 20 depicts a schematic diagram of an ESD protection circuit for an integrated circuit (IC) having mixed supply voltages.

FIG. 20 depicts a schematic diagram of an ESD protection device 2002 for an integrated circuit (IC) 100 having a plurality of various ("mixed") supply voltages $2004_1$ through $2004_n$ (collectively, mixed supply voltages 2004). The embodiment utilizes the capacitive coupling to ground of supply lines other than a protected supply line. The embodiment of FIG. 20 protects the IC circuitry from undesirable ESD discharge occurring at one of the supply voltage lines 2004. The ESD protection device 2002 comprises the capacitance turn-on SCR (CTSCR) 1402, as discussed above with regard to FIG. 14, as well as the diode turn-on SCR (DTSCR) device 1002, as discussed above with regard to FIG. 10.

The supply voltage lines 2004 have parasitic capacitance 2006 (e.g., parasitic capacitance $2006_1$ through $2006_m$) occurring between each supply voltage line and ground 112. That is, the supply voltage lines 2004 (and all devices connected to the supply line 2004) act as distributed plates, such that parasitic capacitance 2006 is generated between the supply lines 2004 and ground 112. The parasitic capacitance 2006 may be used to trigger the SCR 306 instead of the coupling capacitor 1304 discussed in FIGS. 13–15.

Referring to FIG. 20, the protective circuitry 2020 is coupled between two supply voltage lines 2004 and ground 112. The anode 322 of the SCR 306 is coupled to a different voltage supply line (e.g., supply voltages $2004_1$), than the supply voltage line (e.g., supply voltages $2004_2$) coupled to the trigger gate G2 334 of the SCR 306. The protective circuitry 2020 may be utilized to protect the supply line $2004_1$ versus ground 112. Although the latter supply line $2004_1$ is illustratively considered as being subjected to the ESD stress, it is noted that the other potential supply lines are protected as well, but are not being considered as operating under ESD stress conditions. That is, the anode 322 may be coupled to a supply line having a potential that is the same potential (but different supply domain), a lower potential, or a higher potential than the potential of the gate G2 334.

In particular, the trigger gate G2 334 of the PNP transistor 312 of the SCR 306 is coupled to the "lower potential" supply voltage line $2004_2$, which illustratively has a potential of +2.5 volts. The gate G2 334 of the SCR 306 is coupled to supply voltage line $2004_2$ via the serially connected trigger diodes 2010 from the gate G2 334 to the supply voltage $2004_2$.

The emitter of the PNP transistor $312_1$ which forms the anode 322 of the SCR 306, is coupled to supply voltage line $2004_1$ via the serially connected diodes 2008. The holding voltage diodes 2008 (e.g., 3 diodes) are used to maintain the holding voltage of the SCR 306 above the higher potential supply voltage $2004_1$ (e.g., 3.3 volts) to eliminate the risk of latch-up. The supply voltage line $2004_2$ is then coupled to ground 112 (i.e., a reference voltage supply line Vss $2004_{n+1}$) via the parasitic capacitance $2006_1$, which exists between the voltage supply lines $2004_2$ and $2004_{n+1}$ (i.e., ground 112). The first trigger gate G1 336 of the NPN transistor 310 is coupled to ground 112 via the intrinsic substrate resistance 341 of the SCR 306. Additionally, the emitter of the NPN transistor 310 is also coupled to ground 112 to form the cathode of the SCR 306.

The embodiment of FIG. 20 must operate under three conditions. A first condition is during power-up of the mixed voltage IC 100, where the supply voltage lines 2004 are turned-on in an arbitrarily sequence. A second condition is under normal operation, where the SCR 306 must not interfere with normal operation of the IC. That is, a latch-up condition must be prevented. The third condition is under an ESD stress condition, where the IC is not powered up with DC supplies, and the SCR's 306 must quickly shunt the ESD current to ground 112.

Each of these three conditions may be fulfilled by providing an adequate number of diodes 2008 and 2010 in the anode 322 and gate G2 334 paths. It is noted that the holding diodes 2008 in the anode path 322 are provided to increase the holding voltage in the SCR 306 conductive "on" state, at a voltage above the supply voltage to prevent a latch-up condition. As discussed above regarding the desired holding voltage of the SCR 306, a person skilled in the art will easily determine the number of holding diodes required in the ESD protection circuit 2002. The holding diodes 2008 are positioned in the ESD discharge path, and must be sufficiently large to withstand the same amount of stress current as the SCR 306.

The trigger diodes 2010 at the trigger gate G2 341 are optionally provided to fulfill the conditions given by power-up constraints and latch-up prevention. The trigger diodes 2010 may be minimum in size, since only small amounts of trigger currents (as compared to an ESD stress current) are conducted by the SCR 306.

The power-up condition dictates the number of holding and triggering diodes 2008 and 2010 that are utilized. In the worst case during power up, where the supply line connected to the anode 322 is turned on first, while the supply line coupled to the gate G2 334 is still effectively coupled to ground 112, the SCR 306 must not be triggered. Under this worst-case condition, the diode chain consisting of the holding diodes 2008, the internal emitter-base diode of the PNP transistor $312_1$ and the trigger diodes 2010 are forward biased.

To avoid SCR triggering during power-up, the sum of the diode voltages across this entire diode chain (i.e., holding diodes 2008, emitter-base diode $D_p$, and trigger diodes 2010) must at least compensate for the applied anode supply voltage. For example, where the anode 322 is coupled to the 3.3 volt supply line $2004_1$, a total of seven diodes must be utilized in the protective circuit 2020. That is, three holding diodes 2008, the emitter-base diode $D_p$ of the PNP transistor $312_1$ and the three trigger diodes 2010 are required.

Under the non-powered ESD stress condition, all of the voltage supply lines $2004_1$–$2004_n$ are capacitively coupled to ground, due to the parasitic connection 2006 between each line 2004 and ground 112. When a positive ESD event occurs at one of the protected supply lines (e.g., $2004_1$ through $2004_n$), the SCR 306 turns on once the voltage at the protected supply line exceeds the aggregate voltage across the holding diodes 2008, the emitter-base diode $D_p$ of the PNP transistor $312_1$ and the trigger diodes 2010.

It is noted that typically, the maximum number of series diodes in the DTSCR protection device should not exceed 4–5 diodes for limiting the leakage current. However, the present embodiment allows the use of the DTSCR protection device 2002 for higher voltages, since a greater number of turn-on diodes are provided. Further, during normal circuit conditions, the voltage drop across each diode is reduced from of the applied supply voltages biasing the diodes.

It is also noted that the complementary DTSCRS may also be used to protect the supply lines 2004, rather than simply being limited to the protection of an I/O, as illustratively shown in FIGS. 10–13. In particular, one or both branches of the complementary SCR may be used to protect the supply lines with the same or lower voltage level than the G2 reference potential. Such supply line protection may be used in applications where there is no power-up sequence, such that all the supply lines 2004 are ramped up simultaneously.

Figure 21:
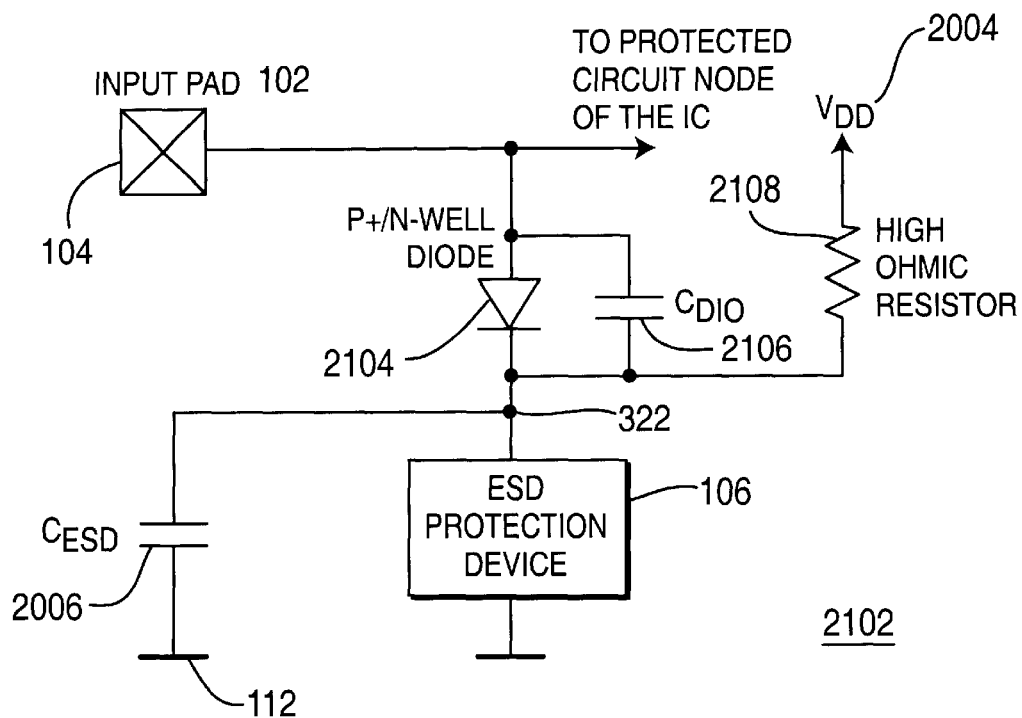
FIG. 21 depicts a schematic block diagram representing an ESD protection circuit of the present invention having reduced parasitic capacitance.

FIG. 21 depicts a schematic block diagram representing an ESD protection circuit 2102 having reduced parasitic capacitance. In particular, the capacitance reduction embodiment of FIG. 21 comprises the ESD protection device 102 (e.g., DTSCR or NMOS devices of FIGS. 3–19) coupled between the pad 104 and ground 112, as discussed above. The parasitic capacitance 2006 (Cesd) is shown existing between the anode 322 and of the ESD protection device 106 and ground 112. The parasitic capacitance 2006 has a capacitance in the range of typically 200 to 3000 femto-Farads. This parasitic capacitance increases with the size of the ESD protection device 106 included on the input pad 104, while a larger size of the ESD protection device provides a higher protection level. Although the embodiment is discussed in terms of the input pad 104, one skilled in the art will understand that the same principles apply to an output or bi-directional pad.

A capacitance reducing diode 2104 is serially coupled in the forward conductive direction between the protective input pad 104 and the anode 322 of the ESD protection device 106. The diode 2104 adds a small voltage drop once the protective circuit 2102 is in the ESD mode of operation. The diode 2104 is typically implemented in a well (e.g., N-well) to isolate it from the substrate. The diode 2104 has a small parasitic junction capacitance value (e.g., 30 to 100 fF), which is much smaller in value than the parasitic capacitance Cesd 2006 of the ESD protection device 106. The diode parasitic capacitance Cdio 2106 and the ESD protection device capacitance Cesd 2006 are coupled in series between the pad 104 and ground 112. The overall capacitance $C_t$ of the protection device 2102 is reduced by the serial relationship (i.e., $C_t$=(Cdio*Cesd)/(Cdio+Cesd)) of the parasitic capacitance. The signal present at the pad 104 will only be influenced by the overall capacitance $C_t$.

Further reduction in the parasitic capacitance of the ESD protection circuit 2102 may be provided by coupling the anode of the ESD protection device 106 to a (positive) supply voltage line 2004, via resistor 2108 (e.g., 1K to 100K Ohms. Under normal circuit operation, the diode 2104 becomes reversed biased, which further reduces the parasitic capacitance Cdio 2106 of the diode 2104. The further reduction in the parasitic capacitance Cdio 2106 of the diode is due to the non-linear dependency between junction capacitance and reverse biasing. During an ESD event, current through the resistor 2108 is limited to a negligible amount. As such, the diode 2104 is forward biased and the ESD protection device 106 may quickly shunt the transient ESD current to ground 112, as discussed above.

In one embodiment, the ESD protection circuit 2102 is used for high-speed circuits. In order to increase the speed of the circuit 100, the parasitic capacitances that load an input signal must be very small. As such, the ESD protection circuit 2102 must not add more than typically 50 to 200 femto-Farads (fF) of parasitic capacitance.

Figure 22:
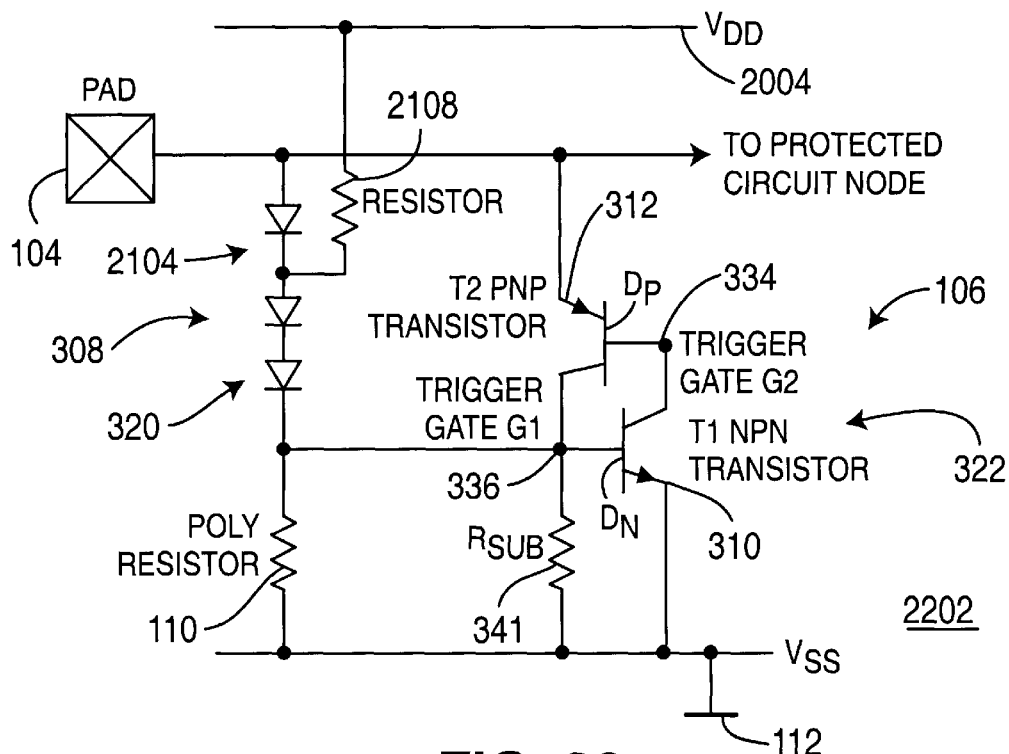
FIGS. 22 through 24 depict schematic diagrams of various embodiments incorporating the teachings of the generic embodiment of FIG. 21.
Figure 23:
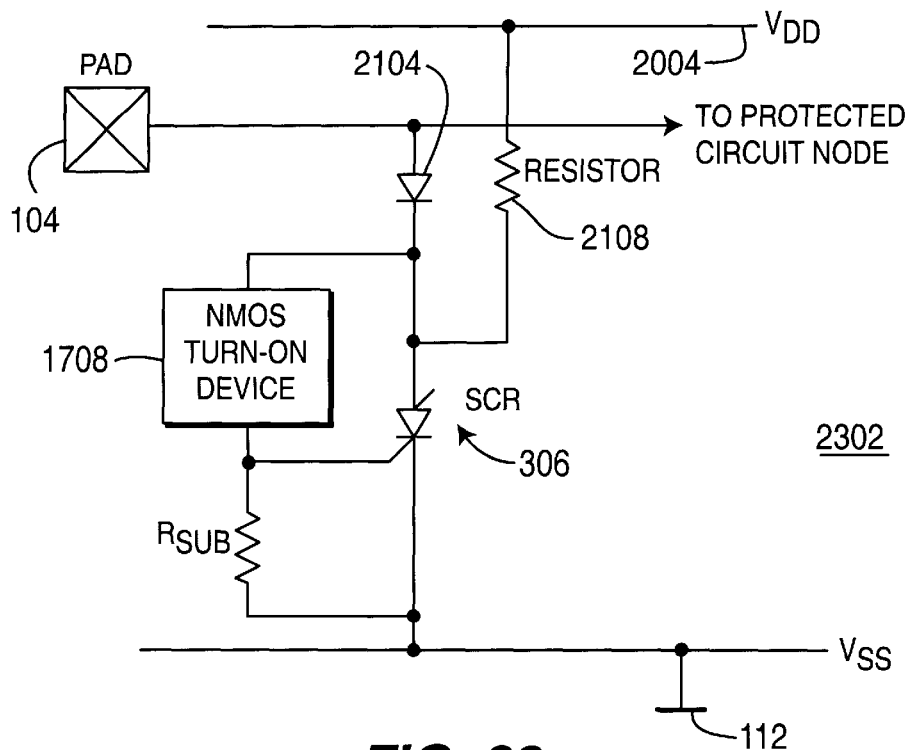
Figure 24:
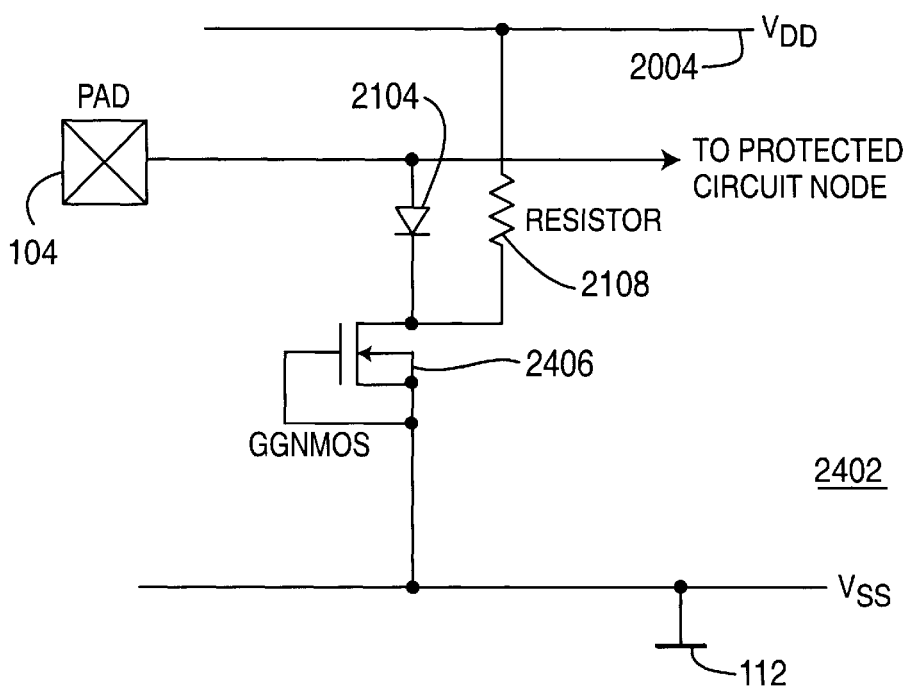

FIGS. 22–24 depict schematic diagrams of various embodiments incorporating the teachings of the generic embodiment 2102 of FIG. 21. FIG. 22 depicts a schematic diagram of an ESD protective circuit 2202 having the capacitance reducing diode 2104 coupled to the DTSCR 302 of FIG. 3. Moreover, the first diode in the diode chain 320 of the trigger device 308 is used as the capacitance reducing diode 2104. The voltage supply line (VDD) 2004 is coupled to the cathode of the capacitance reducing diode 2104 in the diode chain 320 via resistor 2108. As such, the overall capacitance $C_t$ of the protection device 2102 is reduced by the serial relationship between the parasitic capacitance of the capacitor reducing diode 2104 and the parasitic capacitances from other trigger diodes in the trigger device 308 to ground 112, as discussed above.

FIG. 23 depicts a schematic diagram of an ESD protective circuit 2302 having the capacitance reducing diode 2104 coupled to a SCR 306, where the capacitance reducing diode 2104 may already be present in the form of the upper diode of the holding voltage diodes. The capacitance reducing diode 2104 may also be used for other types of ESD protection devices. FIG. 24 illustratively depicts a schematic diagram of an ESD protective circuit 2402 having the capacitance reducing diode 2104 coupled to a grounded-gate NMOS ESD protection device 2406. It should be understood from the teachings in the embodiments of FIGS. 21–24, that the capacitive reducing diode 2104 may be used with at least any of the embodiments depicted in FIGS. 3–19 above. Alternately, the capacitive reducing diode 2104 may be used with other triggering devices, such as a grounded-gate SCR (GGSCR).

Figure 25:
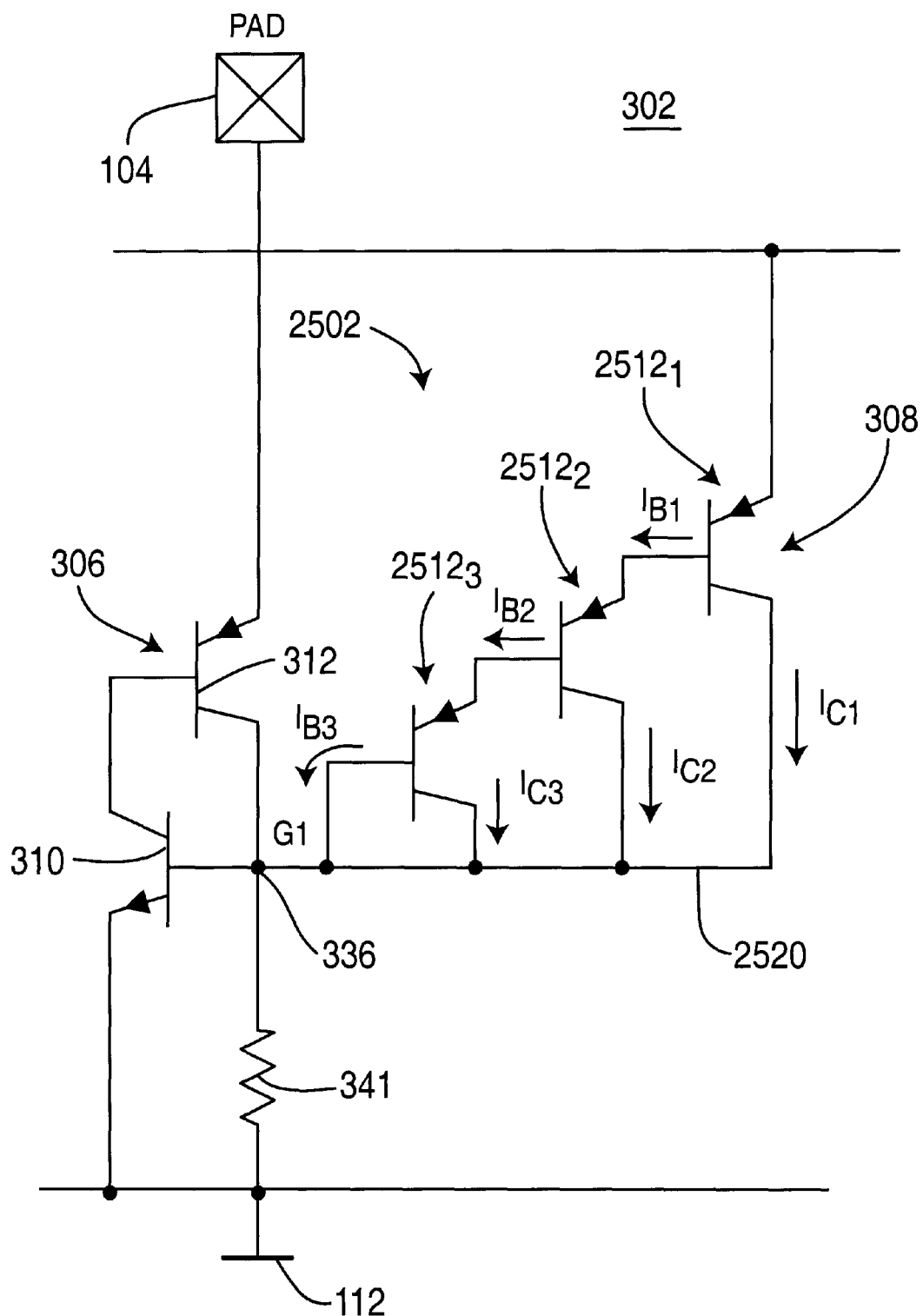
FIG. 25 depicts a schematic diagram of the ESD protection circuit having SCR turn-on diodes act as a Darlington transistor pump.

FIG. 25 depicts a schematic diagram of the ESD protection circuit 302 having SCR turn-on diodes act as a Darlington transistor pump 2502. The ESD protection circuit comprises the SCR 306 coupled between the pad 104 and ground 112. The diode turn-on device 308 is illustratively represented by a three stage Darlington transistor 2502, where each stage $2512_1$ to $2512_3$ (collectively stages 2512) corresponds to a diode $D_s$ in the serially coupled diode chain 320. Specifically, the diodes $D_s$ in the chain 320 of the DTSCR 302 form parasitic PNP transistors with the P-substrate (not shown). That is, the P-substrate forms the collectors of each stage 2512, which is normally coupled to ground 112. The collector of each stage 2512 carries part of the current from each diode (i.e., transistor stage 2512) to the grounded P-substrate (not shown) of the IC 100, thereby increasing the leakage current to the substrate during normal operation and the likelihood that the SCR 306 will fail to trigger.

To alleviate this current loss problem, a plurality of P+ ties 2520 may be formed in the P-substrate and close to the N-well diodes, thereby coupling the collectors of the Darlington transistor 2502 better to a trigger gate, such as trigger gate G1 336, as shown in FIG. 25. The P+ ties may be also used in instances where the diodes $D_s$ are formed in a P-well that is isolated from the P-substrate such as available in a manufacturing process for the IC 100 with "isolated P-well"/"Deep N-well". Furthermore, a manufacturing process for the IC 100 with "triple-wells" (a first N-well inside a quasi-deep P-well, inside a deep N-well) utilizes the Darlington effect that also collects all currents without loss. As such with the aforementioned techniques, the collector currents $I_c$ from each stage 2512, as well as the base current $I_b$ of the last stage $2512_3$ of the Darlington transistor 2502 are coupled to the trigger gate (e.g., trigger gate G1).

Although FIG. 25 depicts the Darlington pump 2502 coupled to the trigger gate G1 336 of the SCR 306, it is understood that the Darlington pump 2502 is alternately coupled to the trigger gate G2 334 for those complementary embodiments having the diode chain 320 coupled to the trigger gate G2 334 of the SCR 306.

It is noted that in an embodiment where a complementary DTCR is used, such as those embodiments depicted in FIGS. 10–13, the Darlington generated substrate current is not lost in the P-substrate as discussed above. Referring to FIG. 11, the diode chain 320 is coupled to the second gate G2 334 formed at the PNP transistor T2 312. As such, the collectors of each Darlington stage, as well as the base of the last stage, are inherently coupled to the P-substrate. The trigger current effective at the second gate G2 334 equals, in this case, the sum of the collector (substrate) currents $I_{c1-3}$ and the base current $I_{b3}$ of the last stage of the Darlington chain.

Figure 32:
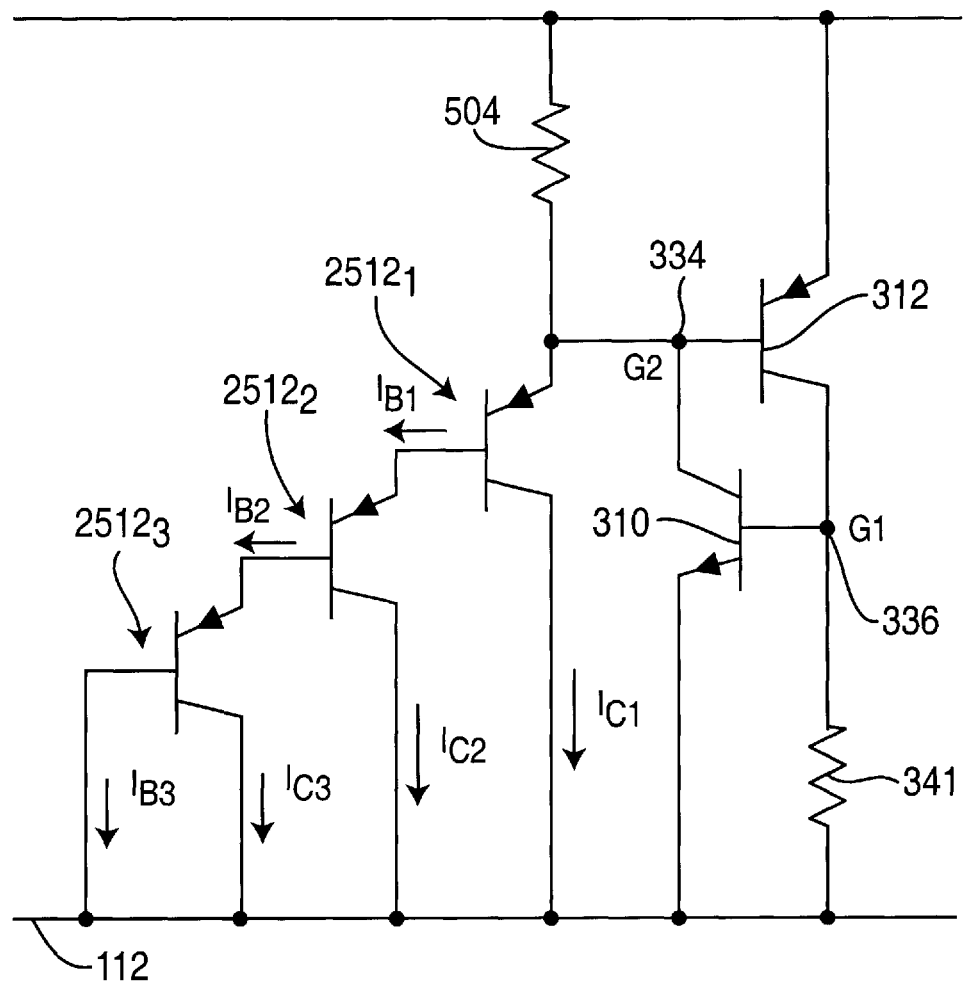
FIG. 32 depicts a schematic diagram of the ESD protection circuit having a complementary SCR turn-on Darlington transistor pump.

FIG. 32 depicts a schematic diagram of the ESD protection circuit 1102 having a complementary SCR turn-on Darlington transistor pump 3202. In fact, FIG. 32 corresponds to the schematic drawing of FIG. 11. The trigger current at the trigger gate G2 334 equals the sum of the collector currents $(I_{c1}+I_{c2+Ic3})$ of each Darlington stage 2512, plus the base current $I_{b3}$ of the last Darlington stage (e.g., $2512_3$). Therefore, the current that is lost due to the Darlington effect, which results from serially coupling triggering diodes $D_s$ to the gate G1 336 of the NPN transistor T1 310, is automatically recovered and used for triggering the gate G2 334 in the complementary DTSCR embodiments.

Figure 26:
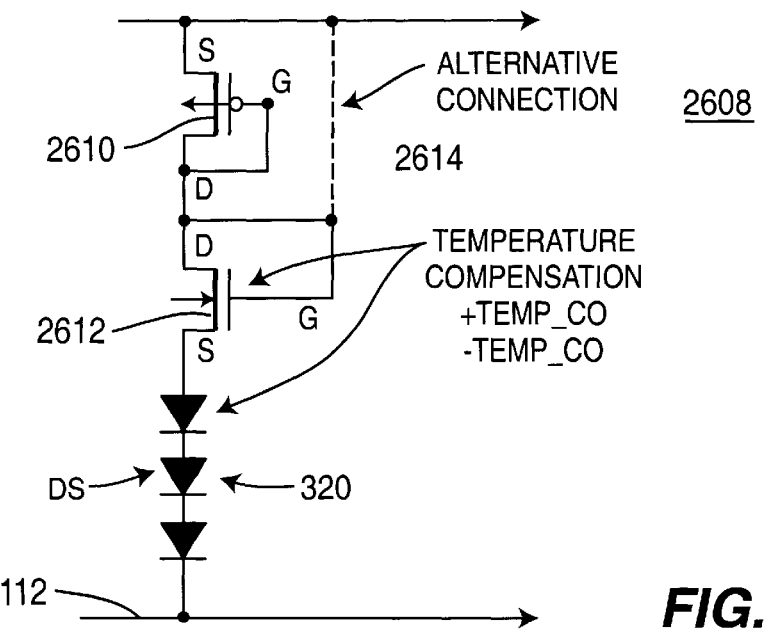
FIG. 26 depicts a schematic diagram of a temperature compensated trigger device of the ESD protection circuit 302.

FIG. 26 depicts a schematic diagram of a temperature compensated trigger device 2608 of the ESD protection circuit 102. The purpose of the temperature compensating triggering device 2608 is to allow the leakage and triggering currents to remain within a particular operating range, regardless of the operating temperatures. That is, the triggering point and leakage currents are substantially independent of the operating temperatures of the IC 100.

The temperature compensated trigger device 2608 comprises at least one MOS device, such as a PMOS device 2610 serially coupled to an NMOS device 2612, which is serially coupled to a diode chain 320. In particular, the source of the PMOS device 2610 is coupled to the pad 104 of line to be protected, while the drain of the PMOS device 2610 is coupled to the drain of the NMOS device 2612. The source of the NMOS device is coupled to an anode of the first diode $D_s$ in the diode chain 320, while the cathode of the last diode in the diode chain 320 is coupled to ground 112. The gate of the PMOS device 2610 is coupled to the drain of the PMOS or any lower potential. The gate of the NMOS device 2612 is coupled to the drain of the NMOS or any higher potential (e.g., line 2614 drawn in phantom).

During operation, when the temperature of the IC 100 increases, the current through the diodes of the diode chain 320 also increases (i.e., a negative temperature coefficient). Further, when the temperature of the IC 100 increases, the current through the MOS devices 2610 and 2612 decreases (i.e., a positive temperature coefficient). As such, the MOS devices 2610 and 2612 compensate for current increases in the diode chain 320, thereby making the triggering relatively independent of the operating temperatures. One skilled in the art will understand that the number of MOS devices in the temperature compensated trigger device 2608 may vary depending on the size and number of diodes in the diode chain 320 and on the actual temperature coefficients of the devices used for the IC 100. Further, the temperature compensated trigger device 2608 may be utilized at either or both gates G1 334 and G2 336.

Figure 27:
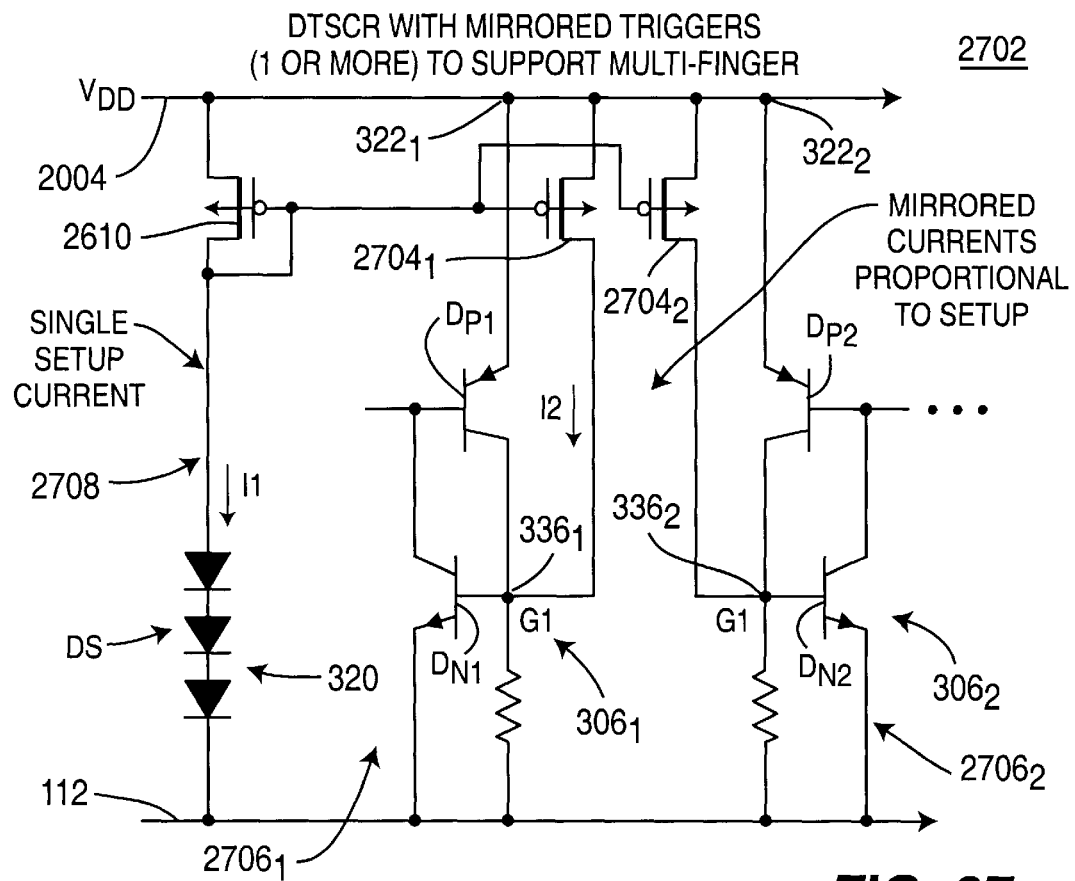
FIG. 27 depicts a schematic diagram of a multi-fingered DTSCR ESD protection device having current mirrored triggers for each DTSCR finger.

FIG. 27 depicts a schematic diagram of a multi-fingered DTSCR ESD protection device 2702 having current mirrored triggers for each SCR finger 2706. The DTSCR ESD protection device 2702 comprises a temperature compensated turn-on chain 2708 coupled to a plurality of SCR fingers $2706_1$ through $2706_n$, where n illustratively equals 2 (n=2). The multi-fingered DTSCR ESD protection device 2702 is illustratively coupled between a supply line VDD 2004 and ground 112. However, one skilled in the art will recognize that the multi-fingered DTSCR ESD protection device 2702 may be coupled between any supply line or an I/O pad 104 to be protected.

The temperature compensated turn-on chain 2708 illustratively comprises a single PMOS device 2610 coupled to three serial diodes forming the diode chain 320, as similarly shown in FIG. 26. The gate of the PMOS device 2610 is coupled to the drain. Furthermore, recall that the diode chain 320 acts as a Darlington transistor, where each diode forms a stage.

Each SCR finger 2706 comprises an SCR 306 having the anode coupled to the supply line VDD 2004 and the cathode coupled to ground 112. Further, a PMOS device 2704 is coupled from the supply line VDD 2004 to be protected, to a trigger gate. For example, the source of PMOS device $2704_1$, is coupled to the supply line 2004, and the drain is coupled to the first trigger gate G1 $336_1$. The gate and drain of the PMOS device 2610 of the temperature compensated turn-on chain 2708 is coupled to each gate of the PMOS device 2704 of each SCR finger 2706.

During an ESD event at the supply line 2004, the current flowing through single turn-on chain 2708 from the supply line 2004 to ground 112, can drive multiple ESD shunt devices (i.e., SCR fingers 2706) with equal trigger currents. Additionally, the holding and clamping voltages are held above the voltage of the supply line 2004, but below the undesirable voltage range 210 of FIG. 2, which may be harmful to the gate oxides of the IC 100. Thus, the trigger currents to each SCR finger 2706 are "mirrored" from the current of the turn-on chain 2708. It is noted that the current mirrors can be set to trigger each or both gates G1 336 and G2 334 of each SCR finger 2706. It is also noted that the mirrored currents are temperature compensated by the temperature compensated turn-on chain 708. It is also noted, that a plurality of the single turn-on chains 2708 may be placed on the IC 100 connecting to a distributed plurality of SCR fingers 2706. All the gates of the MOS devices in the turn-on chain and all the gates of the MOS devices in the SCR fingers are coupled. As such, the distributed turn-on chain will sense efficiently an ESD over-voltage condition on the entire IC 100, and will turn-on all SCR fingers 2706 on the IC 100, thereby providing a maximum level of protection.

It is further noted, that the currents may be scaled by the ratio of the size (length and width) of the MOS transistors 2704 and 2610 such that the trigger current to each trigger gate of each SCR finger 2706 are proportional to the current in the turn-on chain 2708. One skilled in the art will recognize that adding an NMOS device between the diode chain 320 and ground 112, as well as NMOS devices to the second gates G2 334 of the SCR fingers 2706, will allow triggering at the second gates G2 334 of the SCR fingers 2706.

In the embodiments of FIGS. 3–24, the DTSCR device 302 has been used either as a power line to ground power line clamp, or as an input/output to ground clamp. In both cases, the DTSCR device 302 has been used as a two-terminal structure for shunting current in a single direction, either between the power line 2004 and ground 112, or the I/O pad 104 and ground 112. However, an ESD event may occur between any arbitrary pin combination, and the current may have a positive or negative polarity with respect to a particular pin that is considered grounded during the ESD event. As such, the SCR 306 may also be used as a three-terminal device, which provides bi-directional ESD protection between the power line 2004 and ground 112, the I/O pad 104 and ground 112, and the power line 2004 and the I/O pad 104, as discussed with regards to FIGS. 28–30.

Figure 28:
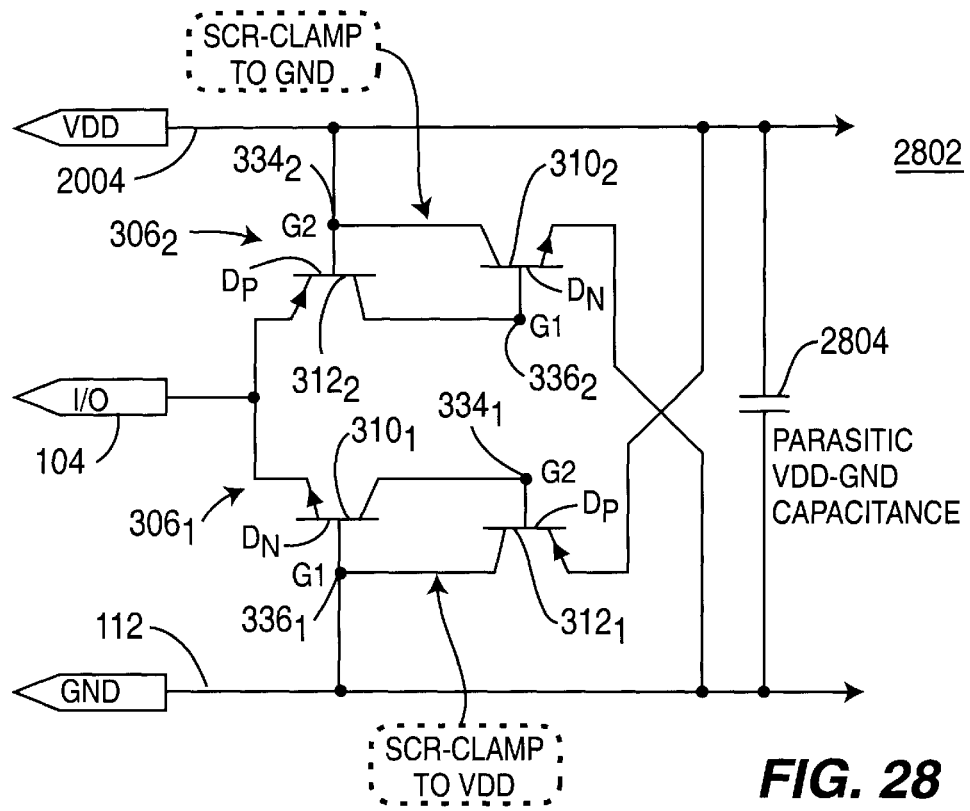
FIGS. 28 to 30 depicts schematic diagrams of various embodiments of a SCR complementary input protection circuit.

FIG. 28 depicts a schematic diagram of a first embodiment of a SCR 306 complementary input protection circuit 2802. The protection circuit 2802 comprises a first and second DTSCR $306_1$ and $306_2$ (first and second leg) coupled between the supply line 2004, the I/O pad 104, and ground 112. Referring to the first SCR $306_1$, the emitter (i.e., anode) of the PNP transistor $312_1$ is coupled to the supply line 2004, and the base of the PNP transistor $312_1$, is coupled to the collector of the NPN transistor 310. The collector of the PNP transistor $312_1$ is coupled to the first trigger gate G1 $336_1$ which is coupled, to the base of the NPN transistor $310_1$. The emitter (i.e., cathode) of the NPN transistor $310_1$ is coupled to the I/O pad 104, and the first trigger gate G1 $336_1$ is coupled to ground 112.

Referring to the second SCR $306_2$, the emitter (i.e., anode) of the PNP transistor $312_2$ is coupled to the I/O pad 104, and the base of the PNP transistor $312_2$ is coupled to the collector of the NPN transistor $310_2$. The collector of the PNP transistor $312_2$ is coupled to the base of the NPN transistor $310_2$, which forms the first trigger gate G1 3362. The emitter (i.e., cathode) of the NPN transistor $310_1$ is coupled to ground 112, and the second trigger gate G2 $334_2$ is coupled to the supply line 2004.

Diodes are normally added separately to the protection device to provide a conductive path for ESD events of the opposite polarity type where the SCR 306 is inactive. However, one skilled in the art will recognize that such additional diodes (i.e., $D_p$ and $D_n$) may conveniently be used as a portion of the SCR's 306 in which they are already present.

During an ESD event, the first SCR $306_1$ provides a clamp to the supply line 2004 for a regular stress case where a negative ESD event occurs at the I/O pad 104 versus the supply line 2004 at ground potential. The second SCR $306_2$ provides a clamp to ground 112 for a regular stress case where a positive ESD occurs at the I/O pad 104 versus GND 112 at ground potential. The diodes $D_p$ and $D_n$ for the opposite stress cases (positive ESD at the I/O 104 versus supply 2004 at ground potential, and negative ESD at the I/O 104 versus GND 112 at ground potential) are provided by the base-emitter of each SCR 306. During the regular ESD stress cases, one of the base-emitter diodes charges the parasitic VDD-GND capacitance 2804 between supply line 2004 and ground 112. In other words, the VDD-GND capacitance 2804 provides an electric load to enable current flow in these base-emitter diodes. When a voltage drop across the base-emitter diodes at the first gate G1 $336_1$ reaches approximately plus 0.7 volts, or the second gate G2 $334_2$ reaches approximately minus 0.7 volts, the SCR's 306 will turn-on and shunt the ESD current to the respective ground (i.e., either ground 112 or the supply line 2004).

Figure 29:
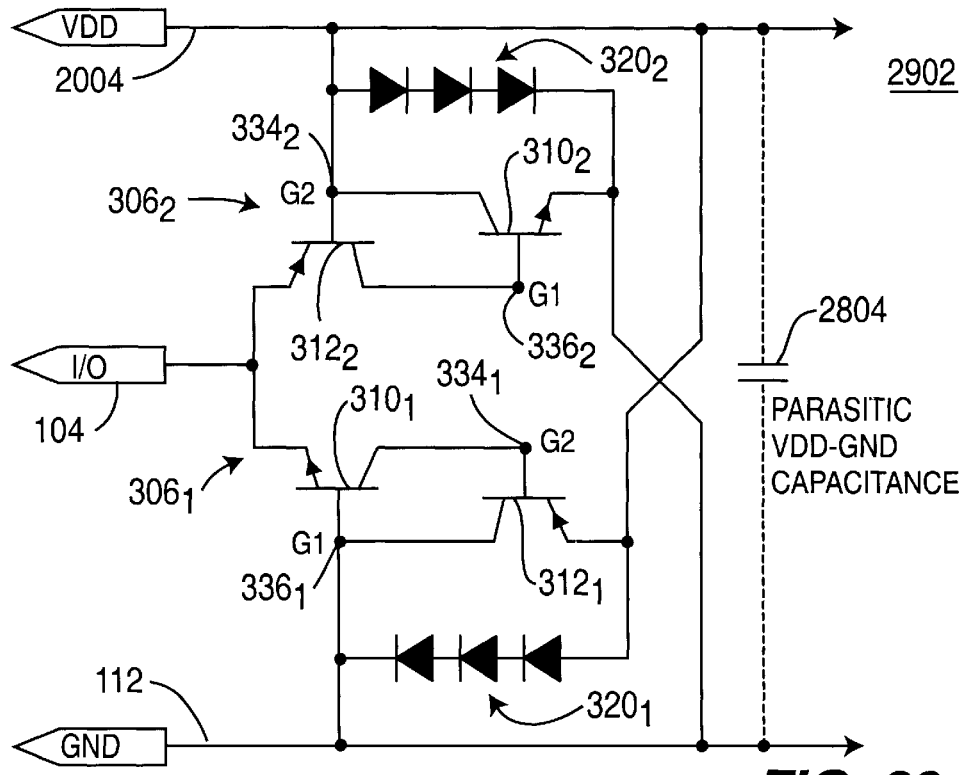

FIG. 29 depicts a schematic diagram of a second embodiment of a SCR 306 complementary input protection circuit 2902. The second embodiment of FIG. 29 is the same as the first embodiment of FIG. 28, except that two additional diode chains $320_1$ and $320_2$ are respectively coupled to the trigger gates of the SCR's $306_1$ and $306_2$. In particular, an anode of a first diode in a first chain 320, (illustratively having 3 serially coupled diodes) is coupled to the emitter of the PNP transistor $312_1$, while the cathode of the last diode in the diode chain $320_1$ is coupled to the first trigger gate G1 $336_1$. Similarly, an anode of a first diode in a second chain $320_2$ (illustratively having 3 serially coupled diodes) is coupled to the second trigger gate G2 $334_2$, while the cathode of the last diode in the diode chain $320_2$ is coupled to the emitter of the NPN transistor $310_2$.

Figure 30:
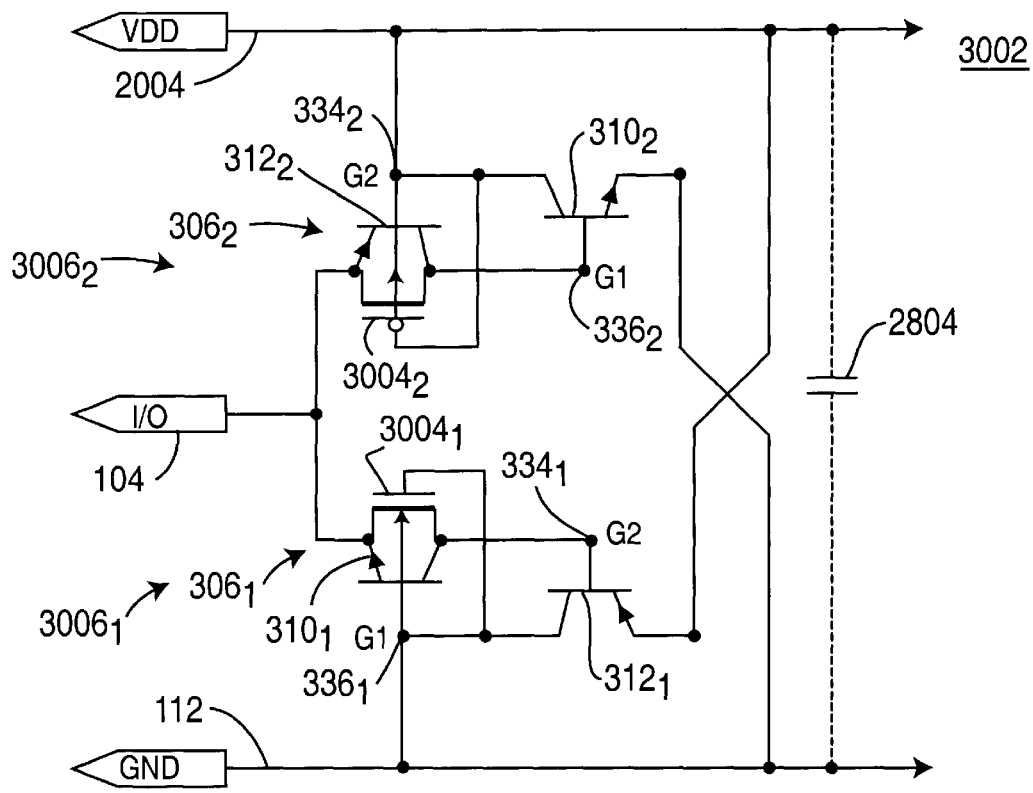

The first and second diode chains $320_1$ and $320_2$ are utilized to provide a load in addition to the capacitive load of the VDD-GND capacitance, and to increase the triggering voltages above the supply line voltages. Referring also to FIG. 2, the first SCR $306_1$ will trigger at approximately 2.8 volts between the I/O pad 104 and ground 112. Further, the same analysis may be applied to the second SCR $306_2$ FIG. 30 depicts a schematic diagram of a third embodiment of a SCR 306 complementary input protection circuit 3002. The third embodiment of FIG. 30 is the same as the first embodiment of FIG. 28 (or second embodiment of FIG. 29), except that each leg $3006_1$ and $3006_2$ of the complementary SCR protection circuit 3002 has a MOS device 3004 as a load element.

In particular, the first SCR leg $3006_1$ comprises a SCR $306_1$ having an NMOS device $3004_1$ coupled in parallel to the NPN transistor $310_1$, such that the source and drain of the NMOS device $3004_1$ are respectively coupled to the emitter and collector of the NPN transistor $310_1$. Further, the gate of the NMOS device $3004_1$, is coupled to the first trigger-gate G1 $336_1$.

Similarly, the second SCR leg $3006_2$ comprises a SCR $306_2$ having a PMOS device $3004_2$ coupled in parallel to the PNP transistor $312_2$, such that the source and drain of the PMOS device $3004_2$ are respectively coupled to the emitter and collector of the PNP transistor $312_2$. Further, the gate of the PMOS device $3004_2$ is coupled to the second trigger gate G2 $334_2$. The MOS devices 3004 have threshold voltages in a range of approximately 0.2 to 0.6 volts, which is less than the respective base-emitter or emitter-base junction voltages (i.e., approximately 0.7 volts) at the trigger gates G1 $336_1$ and G2 $334_2$ of the SCRs $306_1$ and $306_2$ During a positive ESD event, for example, occurring at the supply line (VDD) 2004, where the I/O pad 104 is at ground potential, the ground line 112 will be pulled up to approximately 0.7 volts from the base-emitter junction of the NPN transistor 306$_1$. The gate of the NMOS device 3004$_1$, which is connected to the first trigger gate G1 336$_1$ of the first SCR leg 3006$_1$, has a threshold voltage of less than 0.7V such that the NMOS transistor 3004$_1$ will turn on. It is important to note that the MOS device operates in MOS-mode only, and unlike a prior art device such as the low voltage triggering SCR (LVTSCR) having one NMOS triggering device, no breakdown is utilized. Once the NMOS transistor 3004$_1$ is turned on, the potential of the trigger gate G2 334$_1$ of the SCR 306$_1$ is pulled low and the SCR is predisposed for conduction. As soon as the positive ESD voltage at VDD 2004 exceeds the holding voltage of the SCR 306$_1$, the ESD current will be shunted to the grounded I/O pad 104.

During normal circuit operation the GND supply line 112 is grounded such that a voltage drop does not appear across the base-emitter of the SCR 306$_1$, thereby keeping the gate of the NMOS 3004$_1$ at ground and consequently, the NMOS device 3004$_1$ turned off. A person skilled in the art will recognize that the same operational analysis applies to the second SCR leg 3006$_2$. As such, one benefit of this third embodiment of FIG. 30 is that there is no leakage current during normal operation, as occurs with the diode turn-on chain of FIG. 29.

Although various embodiments that incorporate the teachings of the present invention have been shown and described in detail herein, those skilled in the art can readily devise many other varied embodiments that still incorporate these teachings.

What is claimed is:

1. An electrostatic discharge (ESD) protection circuit in a semiconductor integrated circuit (IC) having protected circuitry, the ESD protection circuit comprising:
   a pad, adapted for connection to a protected circuit node of the IC;
   a silicon controlled rectifier (SCR) having a P-type anode formed in an N-well bulk region, said anode coupled to the pad, and an N-type cathode formed in a P-well bulk region, said cathode coupled to ground; and
   at least one series PN junction diode, each series diode having an anode and a cathode respectively coupled in a forward conduction direction from a second gate of the SCR to ground, wherein the P-type anode and the N-well bulk region of said SCR form a second PN junction diode, said second PN junction diode being serially coupled in a forward direction with said at least one series PN junction diode.

2. The ESD protection circuit of claim 1, further comprising:
   a first resistor, coupled to a first gate of the SCR and ground.

3. The ESD protection circuit of claim 2, wherein the first resistor comprises the intrinsic resistance of the substrate of the ESD protection device.

4. The ESD protection circuit of claim 2, wherein the SCR further comprises a second resistor coupled between the second gate of said SCR and the pad.

5. The ESD protection circuit of claim 4, wherein the second resistor comprises the intrinsic resistance of an N-well of the SCR.

6. The ESD protection circuit of claim 1, further comprising a coupling capacitor coupled between said at least one diode and ground.

7. The ESD protection circuit of claim 1, wherein said coupling capacitor comprises an intrinsic capacitance coupled between said at least one diode and ground.

8. An electrostatic discharge (ESD) protection circuit in a semiconductor integrated circuit (IC) having protected circuitry, the ESD protection circuit comprising:
   a pad, adapted for connection to a protected circuit node of the IC;
   a silicon controlled rectifier (SCR) having a P-doped anode coupled to the pad, and an N-doped cathode coupled to ground, said SCR further comprising a first PN junction defined by said anode formed in a first N-well, a second PN junction between said first N-well and a first P-well, and a third PN junction defined by said P-well and said cathode to collectively form a PNPN sequence, said first, second, and third PN junctions respectively forming first, second, and third PN diodes; and
   at least one series PN junction diode coupled in a forward conduction direction from said first PN diode of the SCR to ground, wherein said first PN diode defines a first diode of a diode chain coupled in the forward conduction direction from the pad to ground.

9. The ESD protection circuit of claim 8, further comprising:
   a first resistor, coupled between the P-type material of the third PN diode of the SCR and ground.

10. The ESD protection circuit of claim 9, wherein the first resistor comprises an intrinsic resistance of said P-well.

11. The protection circuit of claim 10, further comprising:
    a second resistor, coupled between the N-type material of the first PN diode of the SCR and ground.

12. The ESD protection circuit of claim 11, wherein the second resistor comprises an intrinsic resistance of said N-well.

13. The ESD protection circuit of claim 8, further comprising a coupling capacitor coupled between said at least one diode and ground.

14. The ESD protection circuit of claim 8, wherein said coupling capacitor represents an intrinsic capacitance.

\* \* \* \* \*

UNITED STATES PATENT AND TRADEMARK OFFICE
CERTIFICATE OF CORRECTION

PATENT NO. : 6,768,616 B2
DATED : July 27, 2004
INVENTOR(S) : Markus Paul Josef Mefgens et al.

It is certified that error appears in the above-identified patent and that said Letters Patent is hereby corrected as shown below:

Column 5,
Line 46, please change "$312_1$" to -- 312, --.
Line 60, please change "69 volt range" to -- 6-9 volt range --.

Column 6,
Line 61, please change "$312_1$" to -- 312, --.

Column 14,
Line 66, please change "$312_1$" to -- 312, --.

Column 15,
Line 9, please change "$312_1$" to -- 312, --.

Column 19,
Line 43, please change "310." to -- $310_1$. --.
Line 55, please change "G1 3362." to -- G1 362. --.

Column 20,
Line 26, please change "320." to -- $320_1$. --.

Column 22,
Line 44, please change "The protection" to -- The ESD protection --.

Signed and Sealed this

Fifteenth Day of March, 2005

JON W. DUDAS
*Director of the United States Patent and Trademark Office*